(12) United States Patent
Happ et al.

(10) Patent No.: US 7,714,315 B2
(45) Date of Patent: May 11, 2010

(54) THERMAL ISOLATION OF PHASE CHANGE MEMORY CELLS

(75) Inventors: Thomas Happ, Tarrytown, NY (US);
Jan Boris Philipp, Peekskill, NY (US);
Ulrike Gruening-von Schwerin,
München (DE)

(73) Assignees: Qimonda North America Corp., Cary, NC (US); Qimonda AG, Munich (DE)

( * ) Notice: Subject to any disclaimer, the term of this patent is extended or adjusted under 35 U.S.C. 154(b) by 214 days.

(21) Appl. No.: 11/437,211

(22) Filed: May 19, 2006

(65) Prior Publication Data

US 2007/0181932 A1 Aug. 9, 2007

Related U.S. Application Data

(63) Continuation-in-part of application No. 11/348,640, filed on Feb. 7, 2006.

(51) Int. Cl.
*H01L 29/76* (2006.01)

(52) U.S. Cl. ............. 257/5; 365/148; 365/163; 257/314; 257/2; 257/3; 257/4; 438/3; 438/95; 438/102; 438/103; 438/257; 438/599; 438/618

(58) Field of Classification Search ........... 257/2–4, 257/314, E27.004, 5, E31.029; 365/148, 365/163, 129; 438/95, 102, 103, 131, 132, 438/215, 281, 467, 600, 601, 3, 257, 599, 438/618, 625, 652
See application file for complete search history.

(56) References Cited

U.S. PATENT DOCUMENTS

| 6,529,397 B2 * | 3/2003 | Takeda et al. ............. 365/63 |
| 6,674,115 B2 | 1/2004 | Hudgens et al. |
| 6,815,704 B1 | 11/2004 | Chen |
| 6,838,692 B1 | 1/2005 | Lung |
| 6,862,214 B2 * | 3/2005 | Lee et al. ................ 365/163 |
| 6,908,812 B2 | 6/2005 | Lowrey |
| 7,115,927 B2 * | 10/2006 | Hideki et al. ............ 257/296 |
| 7,259,023 B2 * | 8/2007 | Kuo et al. ................. 438/3 |
| 7,295,463 B2 * | 11/2007 | Yang et al. ............. 365/163 |
| 2003/0185047 A1 * | 10/2003 | Khouri et al. ............ 365/163 |
| 2003/0209746 A1 | 11/2003 | Horii |

(Continued)

FOREIGN PATENT DOCUMENTS

DE 10236439 2/2004

(Continued)

OTHER PUBLICATIONS

Bez, R. et al, "Non-volatile memory technologies: emerging concepts and new materials", 2004, Materials Science in Semiconductor Processing, vol. 7, pp. 349-355.*

(Continued)

*Primary Examiner*—Steven Loke
*Assistant Examiner*—Suberr Chi
(74) *Attorney, Agent, or Firm*—Dicke, Billig & Czaja, PLLC

(57) ABSTRACT

A memory includes an array of resistive memory cells, bit lines between rows of the memory cells for accessing the memory cells, and a conductive plate coupled to each of the memory cells.

16 Claims, 25 Drawing Sheets

U.S. PATENT DOCUMENTS

| | | | |
|---|---|---|---|
| 2003/0222292 A1 | 12/2003 | Joo et al. | |
| 2004/0042298 A1 | 3/2004 | Hideki | |
| 2005/0051901 A1 | 3/2005 | Chen | |
| 2005/0112896 A1 | 5/2005 | Hamann et al. | |
| 2005/0185444 A1 | 8/2005 | Yang et al. | |
| 2006/0067112 A1 | 3/2006 | Ferrant et al. | |
| 2007/0108430 A1* | 5/2007 | Lung | 257/4 |
| 2007/0195582 A1* | 8/2007 | Sakata et al. | 365/148 |
| 2007/0215852 A1* | 9/2007 | Lung | 257/4 |
| 2008/0031036 A1* | 2/2008 | Cho | 365/177 |

FOREIGN PATENT DOCUMENTS

| | | |
|---|---|---|
| EP | 1 843 395 | 10/2007 |
| KR | 2004104967 | 12/2004 |
| WO | WO 2004/090984 | * 10/2004 |
| WO | WO 2005/096380 | * 10/2005 |
| WO | 2006009090 | 1/2006 |

OTHER PUBLICATIONS

Chen, Y.C. et al, "Ultra-Thin Phase-Change Bridge Memory Device Using GeSb", 2006, Electron Devices Meeting- IEDM Dec. 11-13, 2006. International, pp. 1-4.*

Lacaita, A.L. et al, "Phase change memories: State of the art, challenges, and perspectives", 2006, Solid-State Electronics, vol. 50, pp. 24-31.*

Ha, Y.H. et al., "An Edge Contact Type Cell For Phase Change RAM Featuring Very Low Power Consumption," 2 pgs., VLSI, 2003.

ECD Ovonics, Research Report, Ovonic Unified Memory, available at http:/222.ovonics.com/PDFs/Elec Memory Research Report/OUM.pdf, 1999, 80 pgs., (1999).

Lankhorst, M.H.R. et al., "Low-Cost And Nanoscale Non-Volatile Memory Concept For Future Silicon Chips," 6 pgs., Nature Materials, published online Mar. 13, 2005; available at 222.nature.com/naturematerials. (2005).

European Search Report mailed Nov. 22, 2007.

"European Search Report mailed Oct. 14, 2008".

* cited by examiner

THERMAL ISOLATION OF PHASE CHANGE MEMORY CELLS

CROSS-REFERENCE TO RELATED APPLICATIONS

This application is a continuation-in-part of U.S. patent application Ser. No. 11/348,640, entitled "THERMAL ISOLATION OF PHASE CHANGE MEMORY CELLS," filed Feb. 7, 2006, which is incorporated herein by reference. This application is related to U.S. patent application Ser. No. 11/260,346, entitled "PHASE CHANGE MEMORY CELL," filed Oct. 27, 2005, which is incorporated herein by reference.

BACKGROUND

One type of non-volatile memory is resistive memory. Resistive memory utilizes the resistance value of a memory element to store one or more bits of data. For example, a memory element programmed to have a high resistance value may represent a logic "1" data bit value, and a memory element programmed to have a low resistance value may represent a logic "0" data bit value. The resistance value of the memory element is switched electrically by applying a voltage or a current to the memory element. One type of resistive memory is magnetic random access memory (MRAM). Another type of resistive memory is phase-change memory. While this invention is described with respect to phase-change memory, the invention is applicable to any suitable type of resistive memory.

Phase-change memory uses a phase-change material for the resistive memory element. Phase-change materials exhibit at least two different states. The states of phase-change material may be referenced to as amorphous and crystalline states. The states may be distinguished because the amorphous state generally exhibits higher resistivity than does the crystalline state. Generally, the amorphous state involves a more disordered atomic structure, while the crystalline state features a more ordered lattice. Some phase-change materials exhibit two crystalline states, e.g. a face-centered cubic (FCC) state and a hexagonal closest packing (HCP) state. These two crystalline states have different resistivities.

Phase change in the phase-change materials may be induced reversibly. In this way, the phase-change material may change from the amorphous state to the crystalline state, and from the crystalline state to the amorphous state, in response to temperature changes. The temperature changes to the phase-change material may be achieved in a variety of ways. For example, a laser can be directed to the phase-change material, electrical current may be driven through the phase-change material, or electrical current can be fed through a resistive heater adjacent the phase-change material. With any of these methods, controllable heating of the phase-change material causes controllable phase change within the phase-change material.

Thermal crosstalk occurs when heat generated within a phase-change memory cell or other resistive memory cell during a write operation of the memory cell is thermally conducted to a neighboring memory cell. During a write operation, there may be a large amount of heating within the selected memory cell, but neighboring memory cells should see no significant temperature rise. If the temperature rise at the location of the neighboring memory cell caused by the conducted heat is large enough, the state of the neighboring memory cell may be affected and the data stored therein may be corrupted.

Typical phase-change memories operating at room temperature are usually not affected by thermal cross-talk. For example, for a typical phase-change memory using $Ge_2Sb_2Te_5$ for the resistive elements, the temperature increase of a neighboring phase-change memory cell during a reset operation is typically up to about 50° C. Therefore, this phase-change memory operating at room temperature typically has a maximum temperature below 110° C., which is the maximum temperature for an amorphous bit to withstand crystallization for more than 10 years. Therefore, this maximum temperature limits the phase-change memory data retention to 10 years. If, however, the phase-change memory is operating at an elevated temperature, such as 70° C., the intrinsic heat diffusion is no longer sufficient to guarantee that the neighboring phase-change memory cell temperature will remain below the 110° C. specified for 10 year data retention.

For these and other reasons, there is a need for the present invention.

SUMMARY

One embodiment of the present invention provides a memory. The memory includes an array of resistive memory cells, bit lines between rows of the memory cells for accessing the memory cells, and a conductive plate coupled to each of the memory cells.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
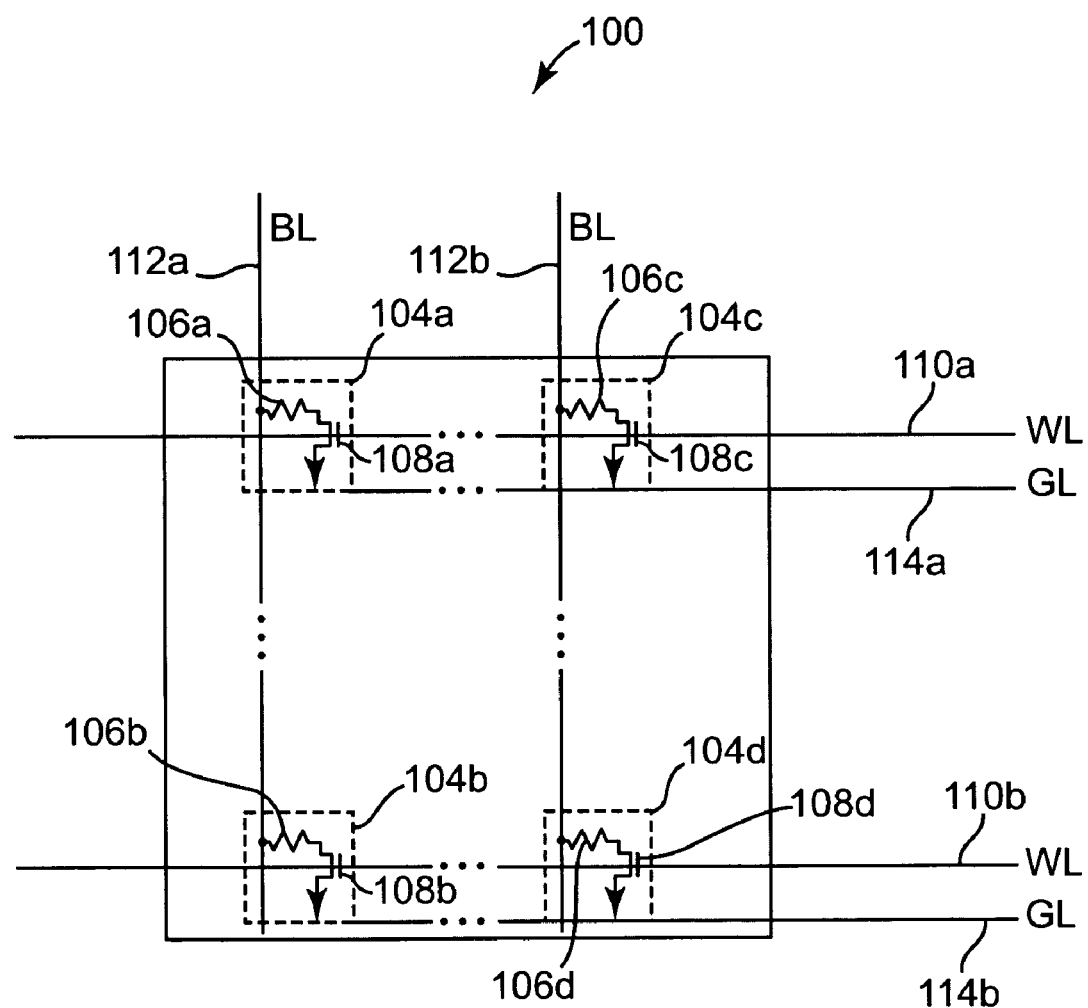
FIG. 1 is a diagram illustrating one embodiment of an array of phase-change memory cells.

FIG. 1 is a diagram illustrating one embodiment of an array of phase-change memory cells 100. Memory array 100 includes thermal isolation between the memory cells to prevent thermal cross-talk from affecting the data retention of the memory cells. Memory array 100 includes a plurality of phase-change memory cells 104a-104d (collectively referred to as phase-change memory cells 104), a plurality of bit lines (BLs) 112a-112b (collectively referred to as bit lines 112), a plurality of word lines (WLs) 110a-110b (collectively referred to as word lines 110), and a plurality of ground lines (GLs) 114a-114b (collectively referred to as ground lines 114).

As used herein, the term "electrically coupled" is not meant to mean that the elements must be directly coupled together and intervening elements may be provided between the "electrically coupled" elements.

Each phase-change memory cell 104 is electrically coupled to a word line 110, a bit line 112, and a ground line 114. For example, phase-change memory cell 104a is electrically coupled to bit line 112a, word line 110a, and ground line 114a, and phase-change memory cell 104b is electrically coupled to bit line 112a, word line 110b, and ground line 114b. Phase-change memory cell 104c is electrically coupled to bit line 112b, word line 110a, and ground line 114a, and phase-change memory cell 104d is electrically coupled to bit line 112b, word line 110b, and ground line 114b.

Each phase-change memory cell 104 includes a phase-change element 106 and a transistor 108. While transistor 108 is a field-effect transistor (FET) in the illustrated embodiment, in other embodiments, transistor 108 can be other suitable devices such as a bipolar transistor or a 3D transistor structure. Phase-change memory cell 104a includes phase-change element 106a and transistor 108a. One side of phase-change element 106a is electrically coupled to bit line 112a, and the other side of phase-change element 106a is electrically coupled to one side of the source-drain path of transistor 108a. The other side of the source-drain path of transistor 108a is electrically coupled to ground line 114a. The gate of transistor 108a is electrically coupled to word line 110a. Phase-change memory cell 104b includes phase-change element 106b and transistor 108b. One side of phase-change element 106b is electrically coupled to bit line 112a, and the other side of phase-change element 106b is electrically coupled to one side of the source-drain path of transistor 108b. The other side of the source-drain path of transistor 108b is electrically coupled to ground line 114b. The gate of transistor 108b is electrically coupled to word line 110b.

Phase-change memory cell 104c includes phase-change element 106c and transistor 108c. One side of phase-change element 106c is electrically coupled to bit line 112b and the other side of phase-change element 106c is electrically coupled to one side of the source-drain path of transistor 108c. The other side of the source-drain path of transistor 108c is electrically coupled to ground line 114a. The gate of transistor 108c is electrically coupled to word line 110a. Phase-change memory cell 104d includes phase-change element 106d and transistor 108d. One side of phase-change element 106d is electrically coupled to bit line 112b and the other side of phase-change element 106d is electrically coupled to one side of the source-drain path of transistor 108d. The other side of the source-drain path of transistor 108d is electrically coupled to ground line 114b. The gate of transistor 108d is electrically coupled to word line 110b.

In another embodiment, each phase-change element 106 is electrically coupled to a ground line 114 and each transistor 108 is electrically coupled to a bit line 112. For example, for phase-change memory cell 104a, one side of phase-change element 106a is electrically coupled to ground line 114a. The other side of phase-change element 106a is electrically coupled to one side of the source-drain path of transistor 108a. The other side of the source-drain path of transistor 108a is electrically coupled to bit line 112a. In general, the ground lines 114 have a lower potential than the bit lines 112. Nevertheless, in another embodiment, ground lines 114 may have a higher potential than bit lines 112.

Each phase-change element 106 comprises a phase-change material that may be made up of a variety of materials in accordance with the present invention. Generally, chalcogenide alloys that contain one or more elements from group VI of the periodic table are useful as such materials. In one embodiment, the phase-change material of phase-change element 106 is made up of a chalcogenide compound material, such as GeSbTe, SbTe, GeTe or AgInSbTe. In another embodiment, the phase-change material can be chalcogen free, such as GeSb, GaSb, InSb, or GeGaInSb. In other embodiments, the phase-change material can be made up of any suitable material including one or more of the elements Ge, Sb, Te, Ga, As, In, Se, and S.

Memory array 100 includes thermal isolation between adjacent phase-change memory cells 104. In one embodiment, each phase-change memory element 106 is surrounded by a material providing thermal insulation and the space between the memory cells is at least partially filled with a material providing thermal conduction. The material providing thermal conduction dissipates any heat leaking through the material providing thermal insulation around each phase-change element 106. The combination of both insulation and facilitated heat spreading keeps adjacent phase-change memory cells 104 cooler during set and particularly reset operations. Therefore, thermal cross-talk is reduced and data retention is improved.

In another embodiment, a material with high thermal conductivity is placed between adjacent phase-change memory cells 104. An additional metallic or semiconductor heat shield or heat spreader is placed between adjacent phase-change elements 106. The heat spreader quickly distributes heat over the length of several memory cells and thus effectively serves to cool phase-change elements 106 and shields adjacent phase-change elements 106 from heating. In one embodiment, the heat spreaders are formed as a 2D network between phase-change elements 106. In another embodiment, the heat spreaders are formed in parallel between the phase-change elements 106 in the direction in which adjacent phase-change elements are the closest together in memory array 100.

In another embodiment, a metal line is routed between adjacent phase-change elements 106. The metal line can be an active metal line within memory array 100, such as a ground line 114 or a bit line 112. This embodiment has the additional advantage that the bottom electrode and a phase-change element 106 for a phase-change memory cell 104 can be formed using line lithography at an angle, such as 90 degrees or other suitable angle, to the underlying metal line and selective etching to the underlying metal line. A line lithography for a given lithography node has a better resolution and line width control than a contact hole pattern and thus improves stability of the geometrical dimensions of a phase-change memory cell 104 and hence the switching properties of a phase-change memory cell 104.

During a set operation of phase-change memory cell 104a, a set current or voltage pulse is selectively enabled and sent through bit line 112a to phase-change element 106a thereby heating it above its crystallization temperature (but usually below its melting temperature) with word line 110a selected to activate transistor 108a. In this way, phase-change element 106a reaches its crystalline state during this set operation. During a reset operation of phase-change memory cell 104a, a reset current or voltage pulse is selectively enabled to bit line 112a and sent to phase-change material element 106a. The reset current or voltage quickly heats phase-change element 106a above its melting temperature. After the current or voltage pulse is turned off, the phase-change element 106a quickly quench cools into the amorphous state. Phase-change memory cells 104b-104d and other phase-change memory cells 104 in memory array 100 are set and reset similarly to phase-change memory cell 104a using a similar current or voltage pulse.

Figure 2:
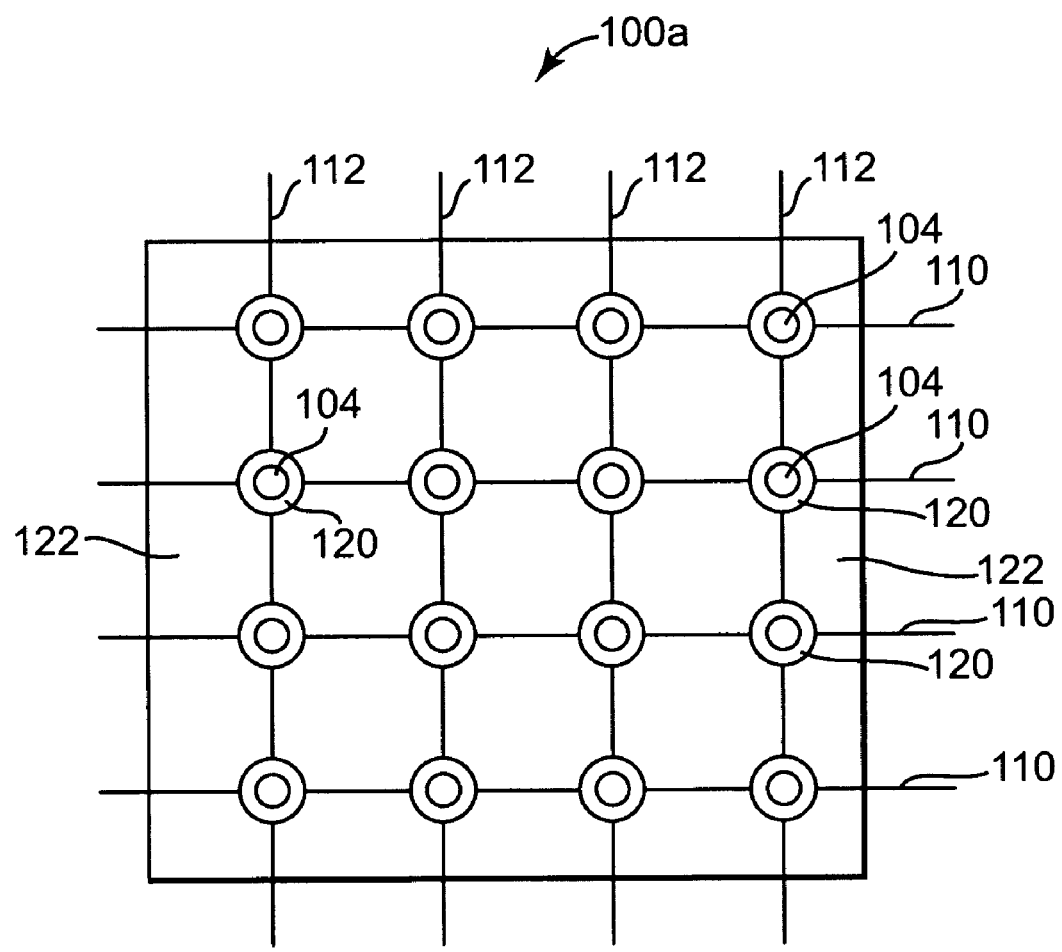
FIG. 2 is a diagram illustrating one embodiment of an array of phase-change memory cells including thermal isolation.

FIG. 2 is a diagram illustrating one embodiment of an array of phase-change memory cells 100a including thermal isolation. Memory array 100a includes bit lines 112, word lines 110, phase-change memory cells 104, first insulation material 120, and second insulation material 122. Each phase-change memory cell 104 or each memory element 106 within each phase-change memory cell 104 is surrounded by a first insulation material having a low thermal conductivity, such as $SiO_2$, a low-k material, porous $SiO_2$, aerogel, xerogel, or another suitable insulation material having a low thermal conductivity. Second insulation material 122 is between memory cells 104 and is in contact with first insulation material 120. Second insulation material 122 includes a dielectric material having a higher thermal conductivity than first insulation material 120. Second insulation material 122 includes SiN, SiON, AlN, $TiO_2$, $Al_2O_3$, or another suitable dielectric material having a higher thermal conductivity than first insulation material 120.

The low thermal conductivity of first insulation material 120 thermally isolates memory cells 104. The high thermal conductivity of second insulation material 122 quickly dissipates any heat leaking through first insulation material 120 around memory cells 104. The combination of both thermal insulation due to first insulation material 120 and heat spreading due to second insulation material 122 keeps adjacent phase-change memory cells 104 cooler during set and particularly reset operations. Therefore, thermal cross-talk is reduced and data retention is improved.

Figure 3:
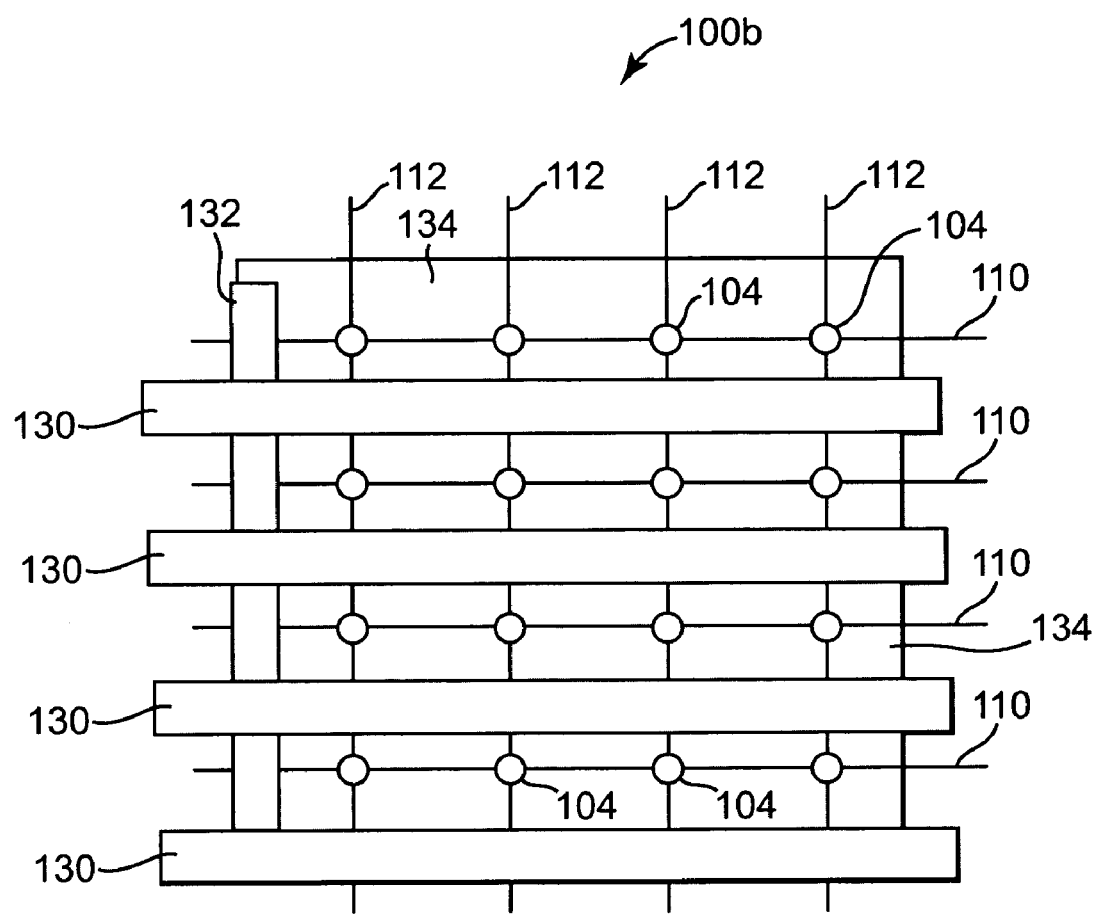
FIG. 3 is a diagram illustrating another embodiment of an array of phase-change memory cells including thermal isolation.

FIG. 3 is a diagram illustrating another embodiment of an array of phase-change memory cells 100b including thermal isolation. Memory array 100b includes bit lines 112, word lines 110, phase-change memory cells 104, first heat spreader or shield lines 130, and optional second heat spreader or shield lines 132. In one embodiment, first heat spreader or shield lines 130 are in parallel across rows of memory array 100b and second heat spreader or shield lines 132 (only one is shown) are in parallel across columns of memory array 100b. In another embodiment, second heat spreader or shield lines 132 are excluded. In one embodiment, first heat spreader or shield lines 130 are in the direction in which adjacent phase-change elements are the closest together in memory array 100b. In another embodiment, first heat spreader or shield lines 130 and/or optional second heat spreader or shield lines 132 are active metal lines, such as bit lines 112 or ground lines 114.

First heat spreader or shield lines 130 and optional second heat spreader or shield lines 132 include a material having a high thermal conductivity, such as SiN, a metal, poly-Si, or another suitable material having a high thermal conductivity. The space 134 between first heat spreader or shield lines 130 and optional second heat spreader or shield lines 132 and memory cells 104 includes an interlayer dielectric such as $SiO_2$, Boro-PhosphoSilicate Glass (BPSG), BoroSilicate Glass (BSG), FlouroSilicate Glass (FSG), low-k material, or another suitable dielectric material. First heat spreader or shield lines 130 and optional second heat spreader or shield lines 132 quickly distribute any heat from a memory cell 104 over the length of several memory cells 104. First heat spreader or shield lines 130 and optional second heat spreader or shield lines 132 thus effectively serve to cool phase-change elements 106 and shield adjacent phase-change elements 106 from heating. Therefore, thermal cross-talk is reduced and data retention is improved.

Figure 4:
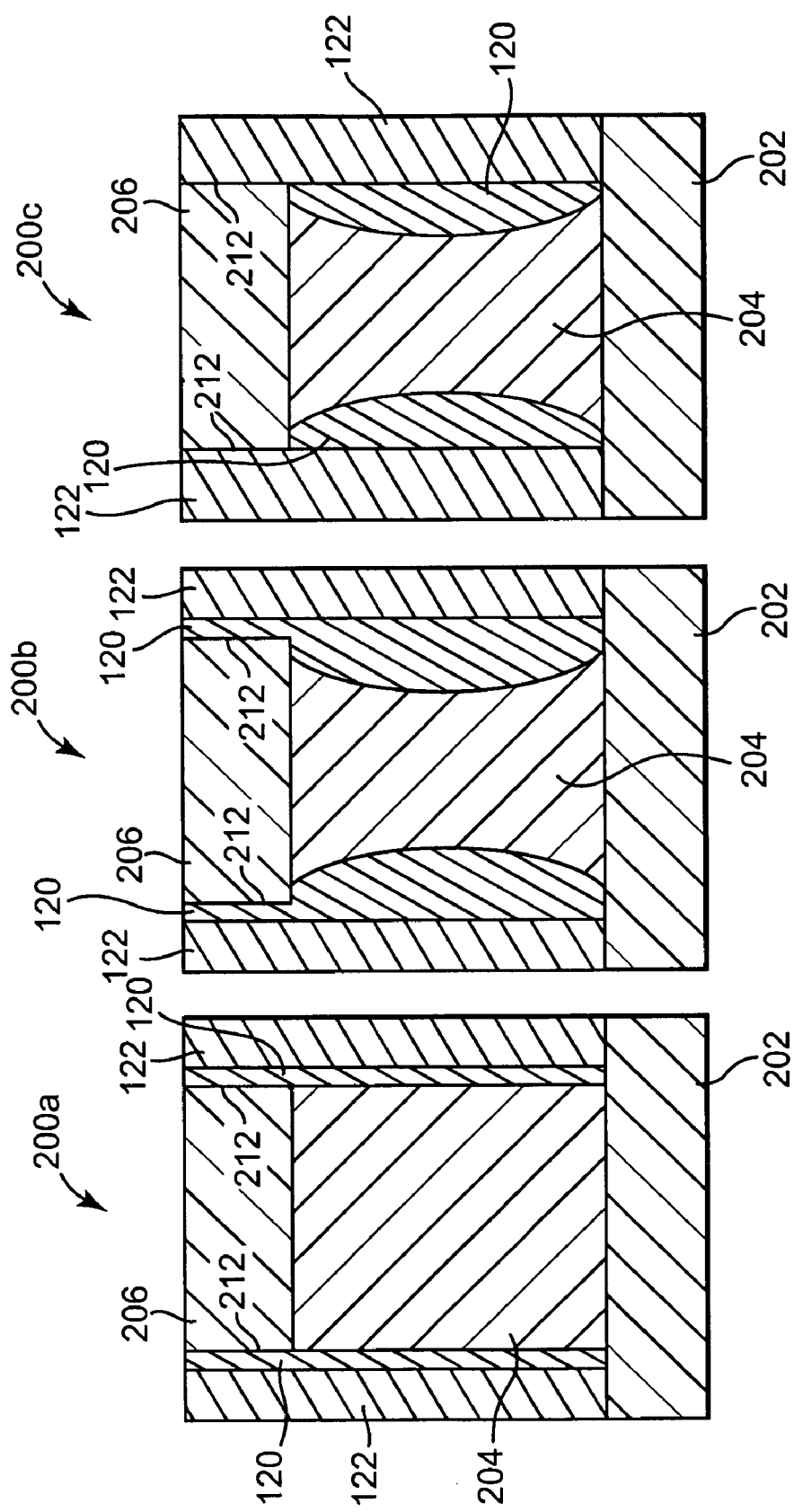
FIG. 4A illustrates a cross-sectional view of one embodiment of a phase-change memory element including thermal isolation.
FIG. 4B illustrates a cross-sectional view of another embodiment of a phase-change memory element including thermal isolation.
FIG. 4C illustrates a cross-sectional view of another embodiment of a phase-change memory element including thermal isolation.

FIG. 4A illustrates a cross-sectional view of one embodiment of a phase-change memory element 200a including thermal isolation. In one embodiment, phase-change memory element 200a is a pillar phase-change memory element. Phase-change memory element 200a is adapted for use in a phase-change memory cell 104 in memory array 100a (FIG. 2). Phase-change memory element 200a includes a first electrode 202, phase-change material 204, a second electrode 206, first insulation material 120, and second insulation material 122. First insulation material 120 has a lower thermal conductivity than second insulation material 122. Phase-change material 204 provides a storage location for storing one bit, two bits, or several bits of data.

Phase-change material 204 contacts first electrode 202 and second electrode 206. Phase-change material 204 is laterally completely enclosed by first insulation material 120, which defines the current path and hence the location of the phase-change region in phase-change material 204. In this embodiment, phase-change material 204 is cylindrical in shape. First insulation material 120 contacts the sides 212 of second electrode 206. Second insulation material 122 surrounds first insulation material 120. In another embodiment, first insulation material 120 contacts both sides of first electrode 202 and second electrode 206.

The low thermal conductivity of first insulation material 120 thermally isolates phase-change material 204. The high thermal conductivity of second insulation material 122 quickly dissipates any heat leaking through first insulation material 120. The combination of both thermal insulation due to first insulation material 120 and heat spreading due to second insulation material 122 keeps adjacent phase-change memory cells cooler during set and particularly reset operations of phase-change memory element 200a.

FIG. 4B illustrates a cross-sectional view of another embodiment of a phase-change memory element 200b. In one embodiment, phase-change memory element 200b is a pillar phase-change memory element. Phase-change memory element 200b is adapted for use in a phase-change memory cell 104 in memory array 100a (FIG. 2). Phase-change memory element 200b includes first electrode 202, phase-change material 204, second electrode 206, first insulation material 120, and second insulation material 122. First insulation material 120 has a lower thermal conductivity than second insulation material 122. Phase-change material 204 provides a storage location for storing one bit, two bits, or several bits of data.

Phase-change material 204 contacts first electrode 202 and second electrode 206. Phase-change material 204 is laterally completely enclosed by first insulation material 120, which defines the current path and hence the location of the phase-change region in phase-change material 204. In this embodiment, phase-change material 204 is hourglass shaped. First insulation material 120 contacts the sides 212 of second electrode 206. Second insulation material 122 surrounds first insulation material 120.

The low thermal conductivity of first insulation material 120 thermally isolates phase-change material 204. The high thermal conductivity of second insulation material 122 quickly dissipates any heat leaking through first insulation material 120. The combination of both thermal insulation due to first insulation material 120 and heat spreading due to second insulation material 122 keeps adjacent phase-change memory cells cooler during set and particularly reset operations of phase-change memory element 200b.

FIG. 4C illustrates a cross-sectional view of another embodiment of a phase-change memory element 200c. In one embodiment, phase-change memory element 200c is a pillar phase-change memory cell. Phase-change memory element 200c is adapted for use in a phase-change memory cell 104 in memory array 100a (FIG. 2). Phase-change memory element 200c includes first electrode 202, phase-change material 204, second electrode 206, first insulation material 120, and second insulation material 122. First insulation material 120 has a lower thermal conductivity than second insulation material 122. Phase-change material 204 provides a storage location for storing one bit, two bits, or several bits of data.

Phase-change material 204 contacts first electrode 202 and second electrode 206. Phase-change material 204 is laterally completely enclosed by first insulation material 120, which defines the current path and hence the location of the phase-change region in phase-change material 204. In this embodiment, phase-change material 204 is hourglass shaped. Second insulation material 122 contacts the sides 212 of second electrode 206 and surrounds first insulation material 120.

The low thermal conductivity of first insulation material 120 thermally isolates phase-change material 204. The high thermal conductivity of second insulation material 122 quickly dissipates any heat leaking through first insulation material 120. The combination of both thermal insulation due to first insulation material 120 and heat spreading due to second insulation material 122 keeps adjacent phase-change memory cells 104 cooler during set and particularly reset operations of phase-change memory element 200c.

Figure 5:
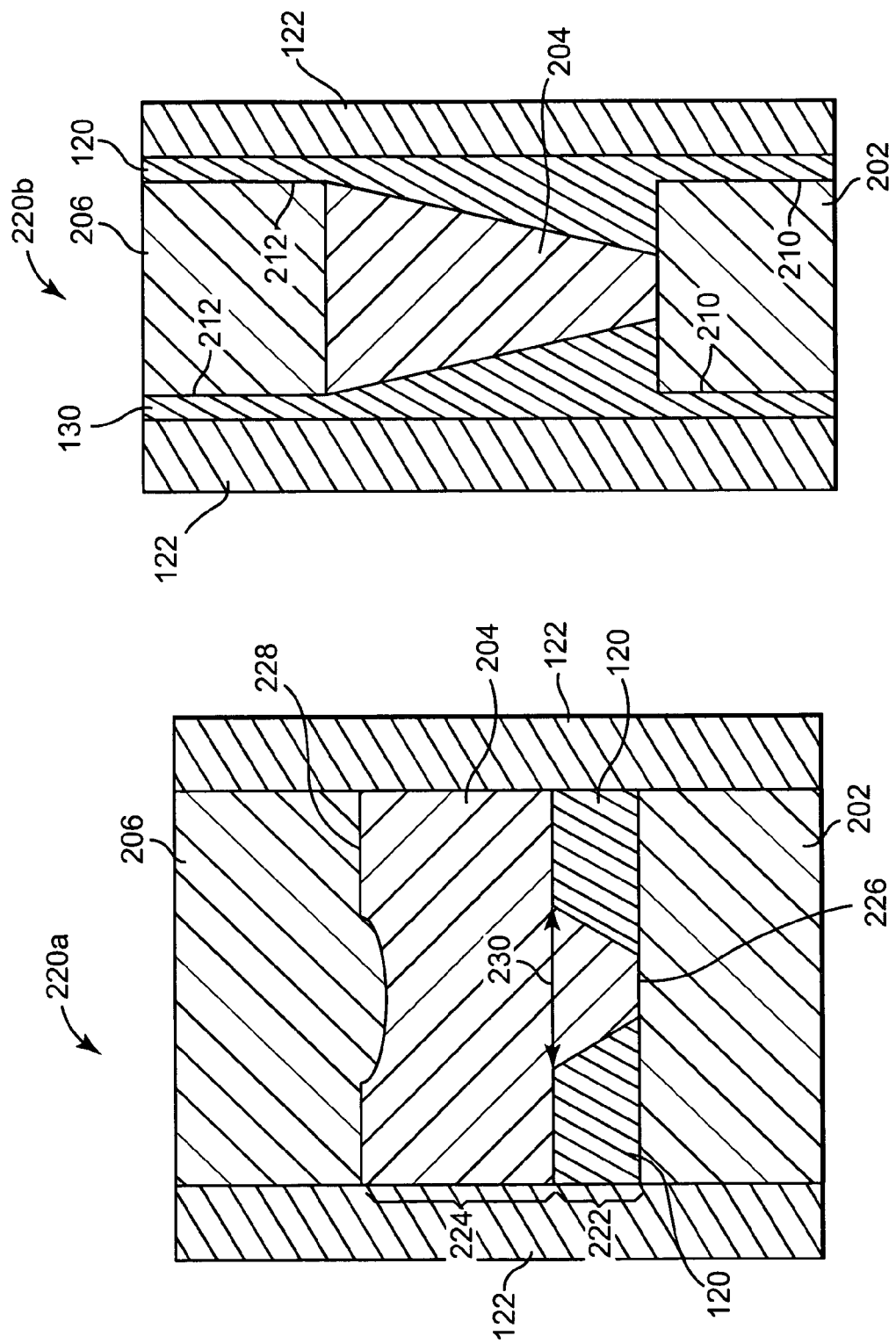
FIG. 5A illustrates a cross-sectional view of another embodiment of a phase-change memory element including thermal isolation.
FIG. 5B illustrates a cross-sectional view of another embodiment of a phase-change memory element including thermal isolation.

FIG. 5A illustrates a cross-sectional view of another embodiment of a phase-change memory element 220a. In one embodiment, phase-change memory element 220a is a tapered via phase-change memory element. Phase-change memory element 220a is adapted for use in a phase-change memory cell 104 in memory array 100a (FIG. 2). Phase-change memory element 220a includes first electrode 202, phase-change material 204, second electrode 206, first insulation material 120, and second insulation material 122. First insulation material 120 has a lower thermal conductivity than second insulation material 122. Phase-change material 204 provides a storage location for storing one bit, two bits, or several bits of data.

Phase-change material 204 includes a first portion 222 in contact with first electrode 202 at 226 and a second portion 224 in contact with second electrode 206 at 228. Phase-change material 204 is filled into a via opening having tapered sidewalls to provide first portion 222. Phase-change material 204 is filled over first portion 222 to provide second portion 224. First portion 222 of phase-change material 204 has tapered sidewalls and has a maximum width or cross-section at 230 and a minimum width or cross-section at 226. The maximum width at 230 of first portion 222 can be less than the width or cross-section of second portion 224. First portion 222 of phase-change material 204 is laterally completely enclosed by first insulation material 120, which defines the current path and hence the location of the phase-change region in phase-change material 204. Second insulation material 122 surrounds first insulation material 120 and second portion 224 of phase-change material 204.

The low thermal conductivity of first insulation material 120 thermally isolates first portion 222 of phase-change material 204. The high thermal conductivity of second insulation material 122 quickly dissipates any heat leaking through first insulation material 120. The combination of both thermal insulation due to first insulation material 120 and heat spreading due to second insulation material 122 keeps adjacent phase-change memory cells cooler during set and particularly reset operations of phase-change memory element 220a.

FIG. 5B illustrates a cross-sectional view of another embodiment of a phase-change memory element 220b. In one embodiment, phase-change memory element 220b is a tapered via phase-change memory element. Phase-change memory element 220b is adapted for use in a phase-change memory cell 104 in memory array 100a (FIG. 2). Phase-change memory element 220b includes first electrode 202, phase-change material 204, second electrode 206, first insulation material 120, and second insulation material 122. First insulation material 120 has a lower thermal conductivity than second insulation material 122. Phase-change material 204 provides a storage location for storing one bit, two bits, or several bits of data.

Phase-change material 204 contacts first electrode 202 and second electrode 206. Phase-change material 204 is laterally completely enclosed by first insulation material 120, which defines the current path and hence the location of the phase-change region in phase-change material 204. In this embodiment, phase-change material 204 has tapered sidewalls. First insulation material 120 contacts the sides 210 of first electrode 202 and sides 212 of second electrode 206. Second insulation material 122 surrounds first insulation material 120.

The low thermal conductivity of first insulation material 120 thermally isolates phase-change material 204. The high thermal conductivity of second insulation material 122 quickly dissipates any heat leaking through first insulation material 120. The combination of both thermal insulation due to first insulation material 120 and heat spreading due to second insulation material 122 keeps adjacent phase-change memory cells cooler during set and particularly reset operations of phase-change memory element 220b.

Figure 6:
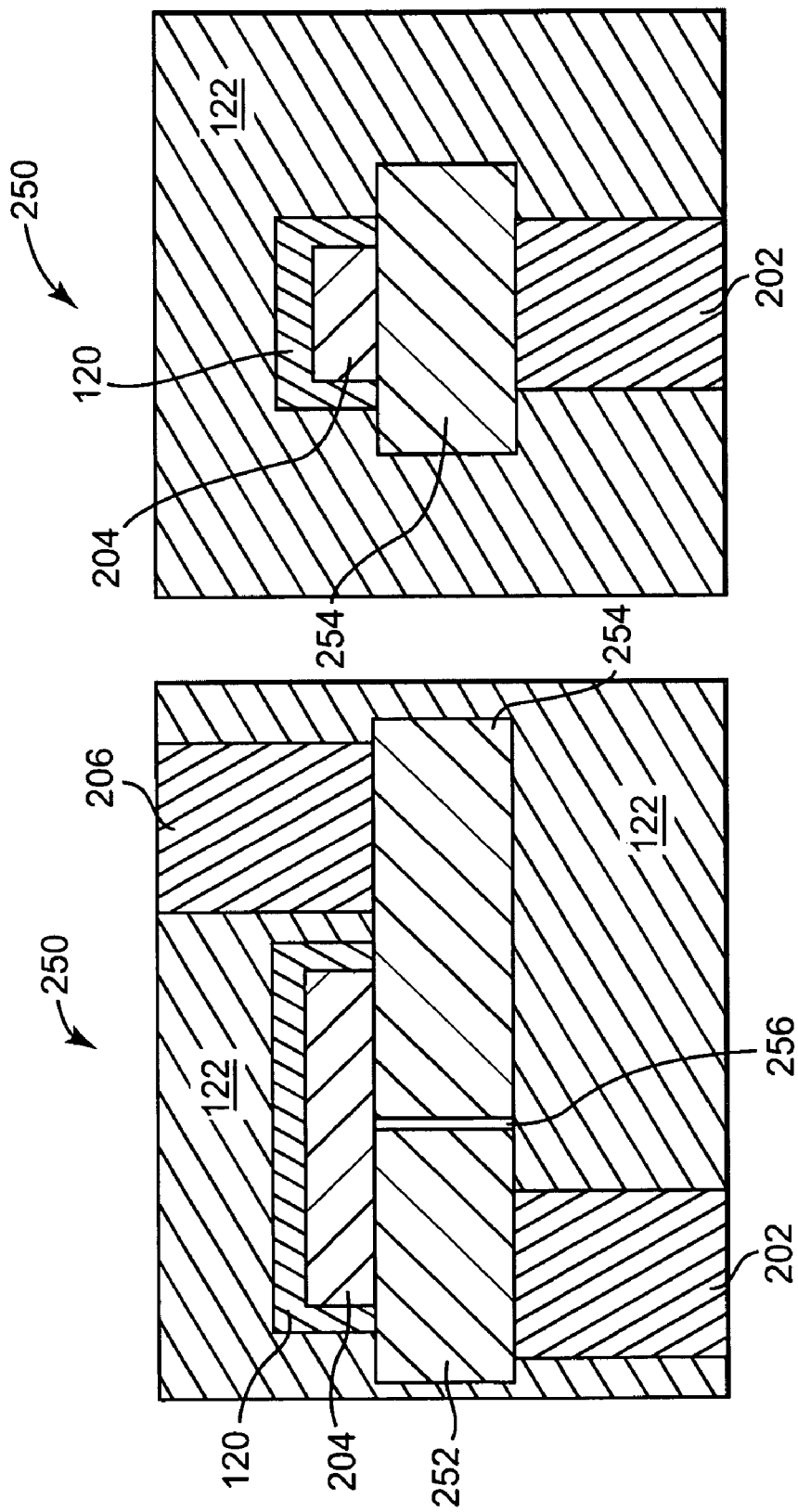
FIG. 6A illustrates a cross-sectional view of another embodiment of a phase-change memory element including thermal isolation.
FIG. 6B illustrates a side cross-sectional view of the phase-change memory element illustrated in FIG. 6A.

FIG. 6A illustrates a cross-sectional view of another embodiment of a phase-change memory element 250, and FIG. 6B illustrates a side cross-sectional view of phase-change memory element 250. In one embodiment, phase-change memory element 250 is a bridge phase-change memory element. Phase-change memory element 250 is adapted for use in a phase-change memory cell 104 in memory array 100a (FIG. 2). Phase-change memory element 250 includes first electrode 202, first contact 252, phase-change material 204, spacer 256, second contact 254, second electrode 206, first insulation material 120, and second insulation material 122. First insulation material 120 has a lower thermal conductivity than second insulation material 122. Phase-change material 204 provides a storage location for storing one bit, two bits, or several bits of data.

Phase-change material 204 contacts first contact 252 and second contact 254 separated by spacer 256. First contact 252 contacts first electrode 202 and second contact 254 contacts second electrode 206. Except where phase-change material 204 contacts 252 and 254 and spacer 256, phase-change material 204 is surrounded by first insulation material 120. Second insulation material 122 surrounds first insulation material 120.

The low thermal conductivity of first insulation material 120 thermally isolates phase-change material 204. The high thermal conductivity of second insulation material 122 quickly dissipates any heat leaking through first insulation material 120. The combination of both thermal insulation due to first insulation material 120 and heat spreading due to second insulation material 122 keeps adjacent phase-change memory cells cooler during set and particularly reset operations of phase-change memory element 250.

Figure 7:
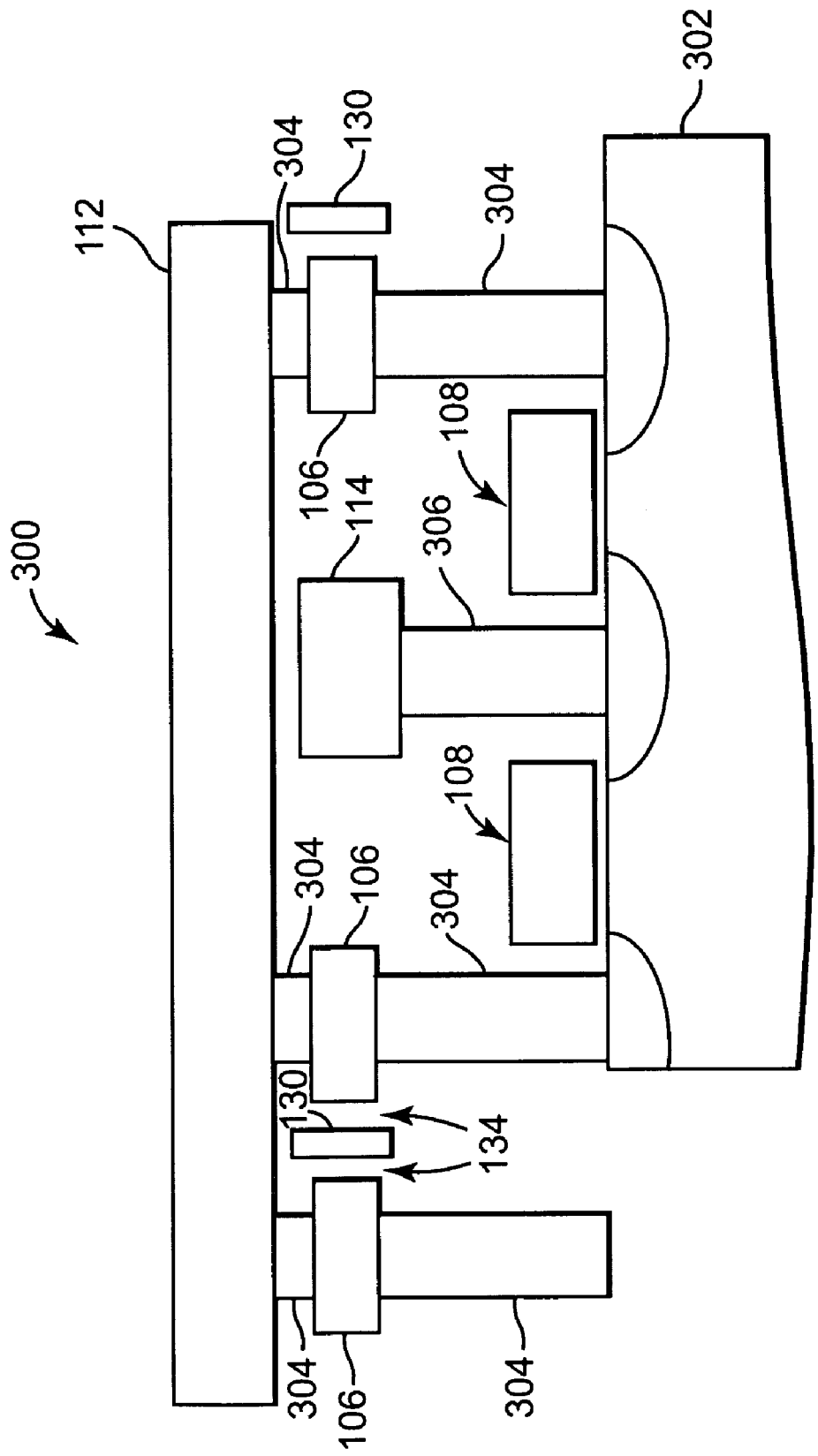
FIG. 7 illustrates a side view of one embodiment of a layout for phase-change memory cells including a heat shield or spreader.

FIG. 7 illustrates a side view of one embodiment of a layout 300 for phase-change memory cells including a heat shield or spreader. Layout 300 for phase-change memory cells is adapted for use in memory array 100b (FIG. 3). Layout 300 includes substrate 302, bit line 112, ground line 114, transistors 108, contacts 304, contacts 306, phase-change elements 106, and heat spreaders or shields 130. Bit line 112 and ground line 114 are in separate metallization layers. In one embodiment, bit line 112 comprises W or another suitable metal and is in a lower metallization layer than ground line 114, which comprises Al, Cu, or another suitable metal. In another embodiment, bit line 112 comprises Al, Cu, or another suitable metal and is in a higher metallization layer than ground line 114, which comprises W or another suitable metal.

In one embodiment, bit line 112 is perpendicular to ground line 114. One side of the source-drain path of each transistor 108 is electrically coupled to ground line 114 through a contact 306, which comprises Cu, W, or another suitable electrically conductive material. The other side of the source-drain path of each transistor 108 is electrically coupled to a bit line 112 through a phase-change element 106 and contact 304, which comprises Cu, W, or another suitable electrically conductive material. The gate of each transistor 108 is electrically coupled to a word line 110, which comprises doped poly-Si, W, TiN, NiSi, CoSi, TiSi, WSi$_x$, or another suitable material. In one embodiment, memory element 106 is a heater cell, an active-in-via cell, a pillar cell, or other suitable phase-change memory element.

Heat spreader or shield lines 130 are provided between adjacent phase-change elements 106 that are close together and not separated by a ground line 114. Heat spreader or shield lines 130 include a material having a high thermal conductivity, such as SiN, a metal, poly-Si, or another suitable material having a high thermal conductivity. The space 134 between heat spreader or shield lines 130 and phase-change elements 106 is filled with an interlayer dielectric such as SiO$_2$, Boro-PhosphoSilicate Glass (BPSG), BoroSilicate Glass (BSG), FlouroSilicate Glass (FSG), a low-k material, or another suitable dielectric material. Heat spreader or shield lines 130 quickly distribute any heat from a phase-change element 106 over the length of several memory cells. Heat spreader or shield lines 130 thus effectively serve to cool phase-change elements 106 and shield adjacent phase-change elements 106 from heating.

Figure 8:
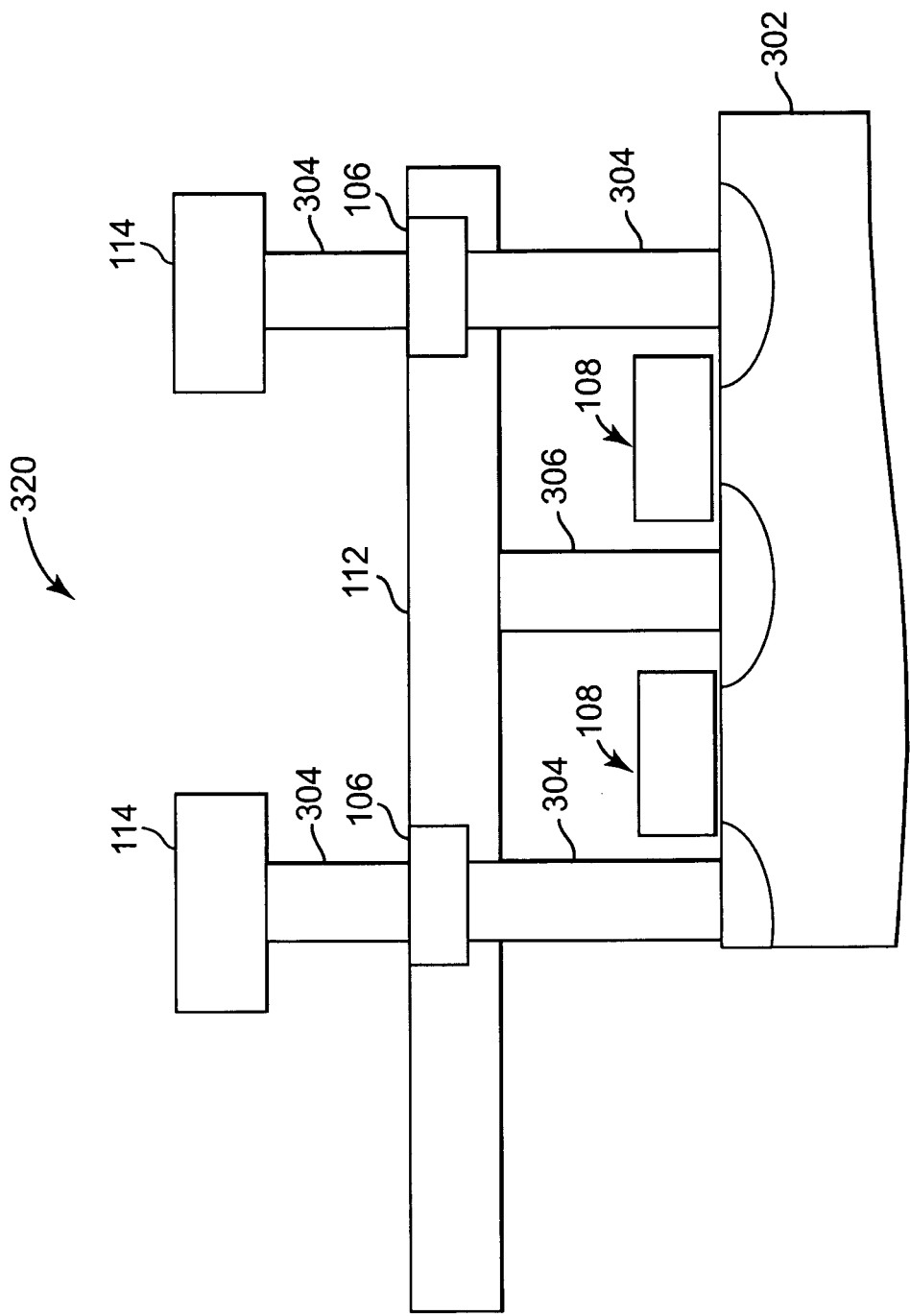
FIG. 8 illustrates a side view of another embodiment of a layout for phase-change memory cells including using an active metal line as a heat spreader.

FIG. 8 illustrates a side view of another embodiment of a layout 320 for phase-change memory cells including using an active metal line as a heat spreader. Layout 320 for phase-change memory cells is adapted for use in memory array 100b (FIG. 3). Layout 320 includes substrate 302, bit line 112, ground lines 114, transistors 108, contacts 304, contacts 306, and phase-change elements 106. Bit line 112 and ground lines 114 are in separate metallization layers. In one embodiment, bit line 112 comprises W or another suitable metal and is in a lower metallization layer than ground line 114, which comprises Al, Cu, or another suitable metal. In another embodiment, bit line 112 comprises Al, Cu, or another suitable metal and is in a higher metallization layer than ground line 114, which comprises W or another suitable metal. In any case, bit line 112 runs perpendicular to word lines 110.

In one embodiment, bit line 112 is perpendicular to ground lines 114. One side of the source-drain path of each transistor 108 is electrically coupled to bit line 112 through a contact 306, which comprises Cu, W, or another suitable conductive material. The other side of the source-drain path of each transistor 108 is electrically coupled to a ground line 114 through a phase-change element 106 and contact 304, which comprises Cu, W, or another suitable electrically conductive material. The gate of each transistor 108 is electrically coupled to a word line 110 (not shown), which comprises doped poly-Si, W, TiN, NiSi, CoSi, TiSi, WSi$_x$, or another suitable material. In one embodiment, memory element 106 is a heater cell, an active-in-via cell, a pillar cell, or other suitable phase-change memory element.

In this embodiment, bit line 112 is in a lower metallization layer than ground lines 114. Phase-change elements 106 are positioned coplanar with bit line 112 such that bit line 112 acts as a heat spreader or shield line 130. In one embodiment, bit lines 112 include insulating sidewall spacers that form sublithographic openings between the bit lines 112. Phase-change material is filled into the sublithographic openings between the spacers to provide phase-change elements 106. The spacer material includes a dielectric material having a low thermal conductivity for thermally isolating the phase-change elements 106. Each bit line 112 provides a heat spreader. Bit line 112 quickly distributes any heat from an adjacent phase-change element 106 over the length of several memory cells. Bit line 112 thus effectively serves to cool phase-change elements 106 and shield adjacent phase-change elements 106 from heating.

Figure 9:
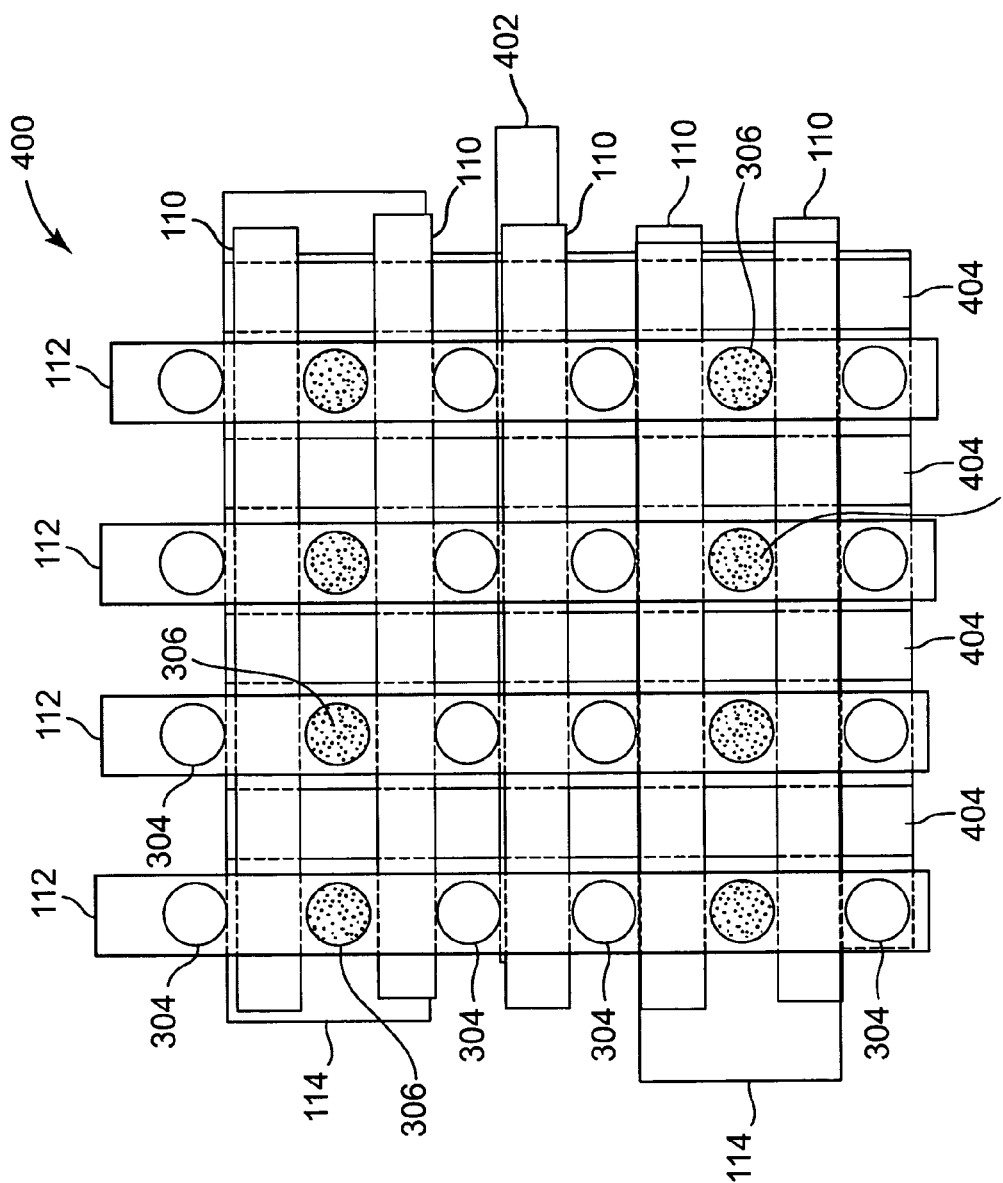
FIG. 9 illustrates a top view of one embodiment of an array of phase-change memory cells including a dummy ground line.

FIG. 9 illustrates a top view of one embodiment of an array of phase-change memory cells 400 including a dummy ground line 402. Array of phase-change memory cells 400 includes bit lines 112, ground lines 114, dummy ground lines 402, word lines 110, and shallow trench isolation 404. Memory cells are coupled to bit lines 112 through contacts 304. Memory cells are coupled to ground lines 114 through contacts 306. Shallow trench isolation 404, or other suitable transistor isolation, is provided parallel to and between bit lines 112. Word lines 110 are perpendicular to bit lines 112 and parallel to ground lines 114 and dummy ground lines 402. Dummy ground lines 402 provide thermal isolation between rows of memory cells as indicated by memory cell contacts 304. Ground lines 114 also provide thermal isolation between adjacent memory cells as indicated by memory cell contacts 304.

Figure 10A:
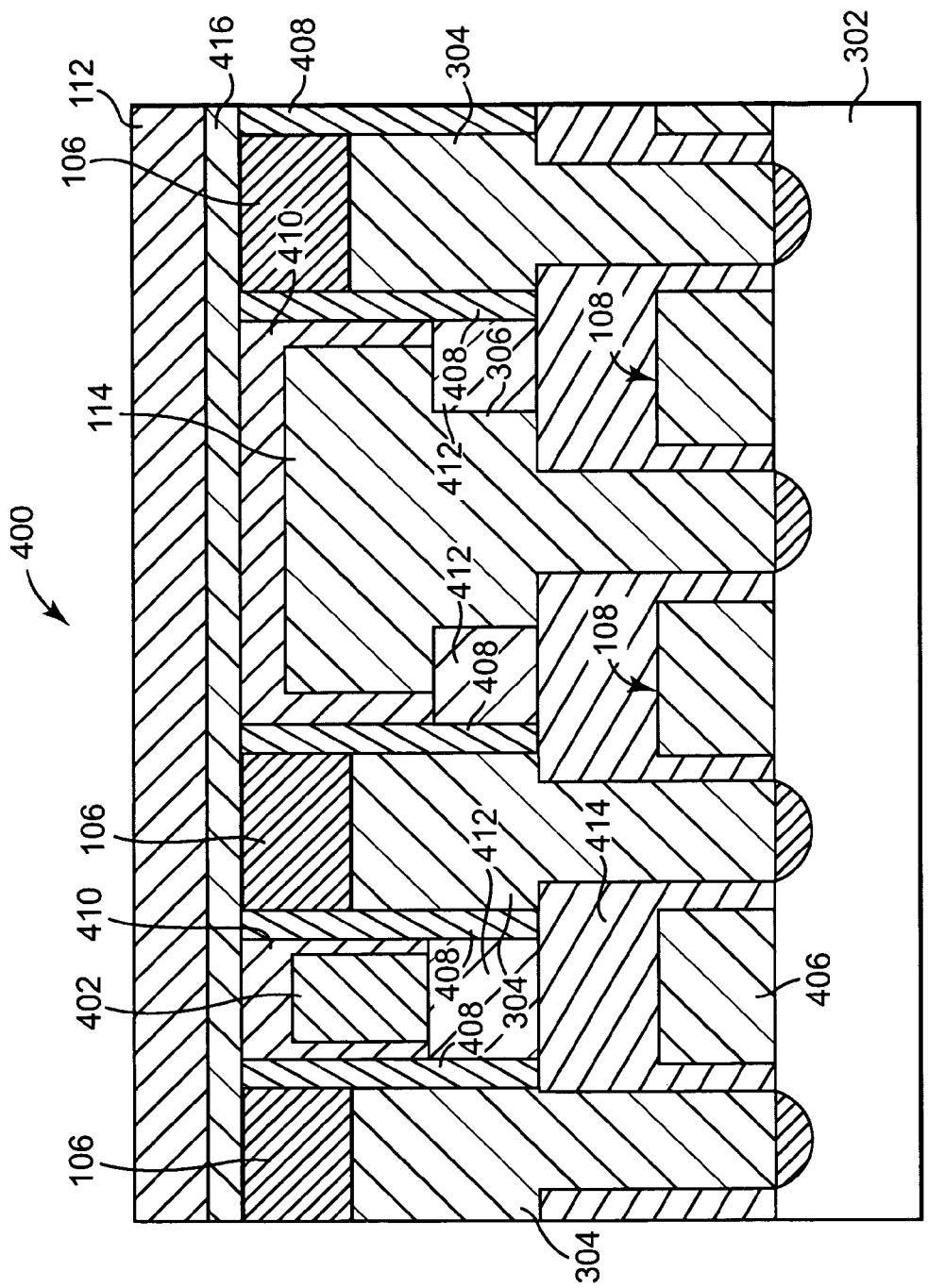
FIG. 10A illustrates a cross-sectional view of one embodiment of a layout for phase-change memory cells including a dummy ground line.
Figure 10B:
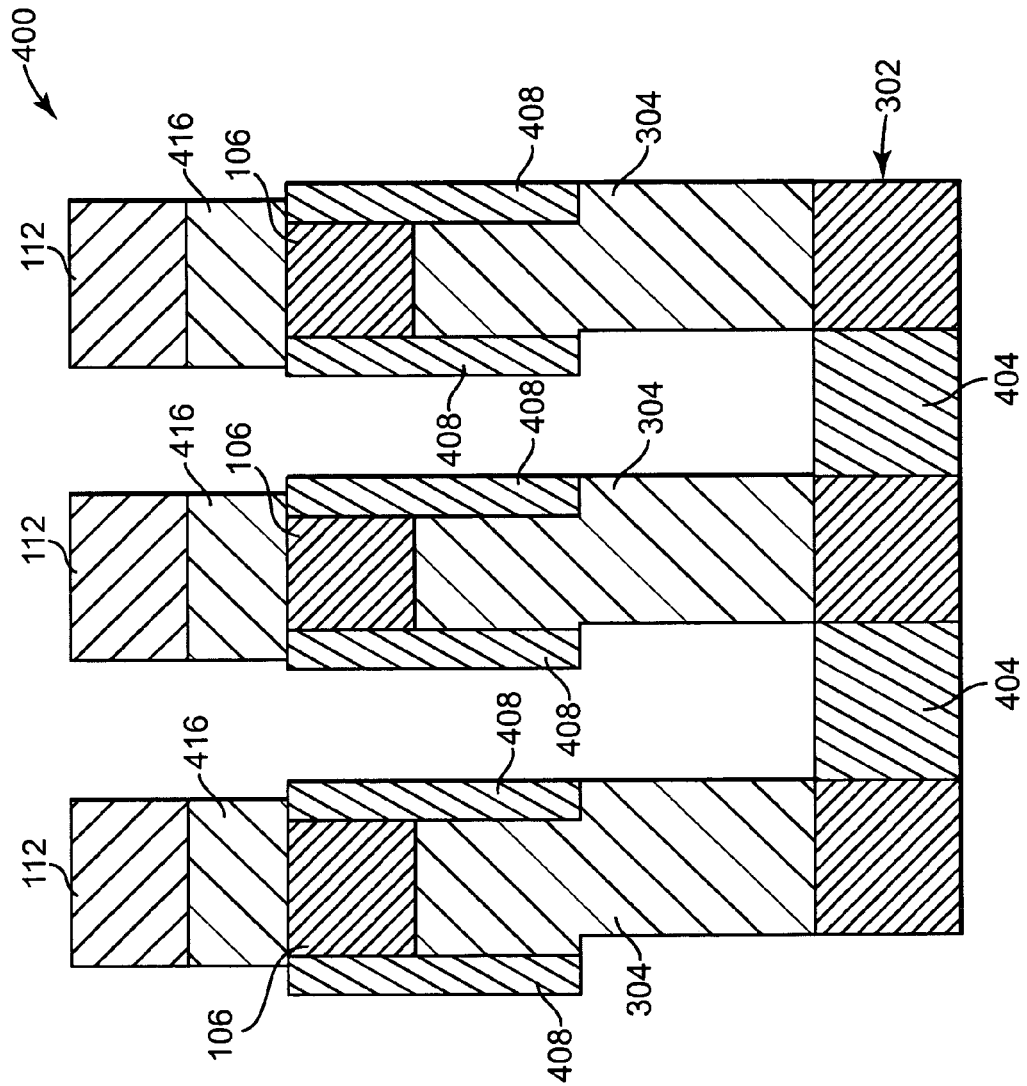
FIG. 10B illustrates a side view of one embodiment of a layout for phase-change memory cells including a dummy ground line.

FIG. 10A illustrates a cross-sectional view of one embodiment of layout 400 for phase-change memory cells including dummy ground line 402, and FIG. 10B illustrates a side view of one embodiment of layout 400 through a phase-change element 106. Layout 400 includes substrate 302, transistors 108, isolation gates 406, ground lines 114, dummy ground lines 402, capping layer 410, spacers 408, phase-change elements 106, phase-change element contacts 304 each including an electrode, ground line contacts 306, electrodes 416, bit lines 112, and dielectric material 412 and 414.

Transistors 108 for selecting phase-change elements 106 are formed on substrate 302. The gates of transistors 108 are electrically coupled to word lines 110. Isolation gates 406 are formed on substrate 302 between transistors 108. Dielectric material 414 is deposited over transistors 108 and isolation gates 406. Phase-change element contacts 304 electrically couple one side of the source-drain path of each transistor 108 to a phase-change element 106, and ground line contacts 306 electrically couple the other side of the source-drain path of each transistor 108 to a ground line 114. Spacers 408 surround phase-change elements 106 and optionally phase-change element contacts 304 to provide a sublithographic width for phase-change elements 106.

Spacers 408 thermally isolate phase-change elements 106. Dummy ground lines 402 extend between phase-change elements 106 that are not separated by a ground line 114. Dummy ground lines 402 and ground lines 114 provide heat spreaders to dissipate heat that passes through spacers 408 from phase-change elements 106. In one embodiment, a SiN or other suitable material capping layer 410 caps ground lines 114 and dummy ground lines 402. Optionally, capping material 410 is also formed at the sidewalls of ground lines 114 and dummy ground lines 402. The capping layer 410 acts as masking layer during storage node etch and further insulates phase-change elements 106 and reduces the width of the openings where phase-change material is deposited. Electrodes 416 electrically couple phase-change elements 106 to bit line 112.

Figure 11:
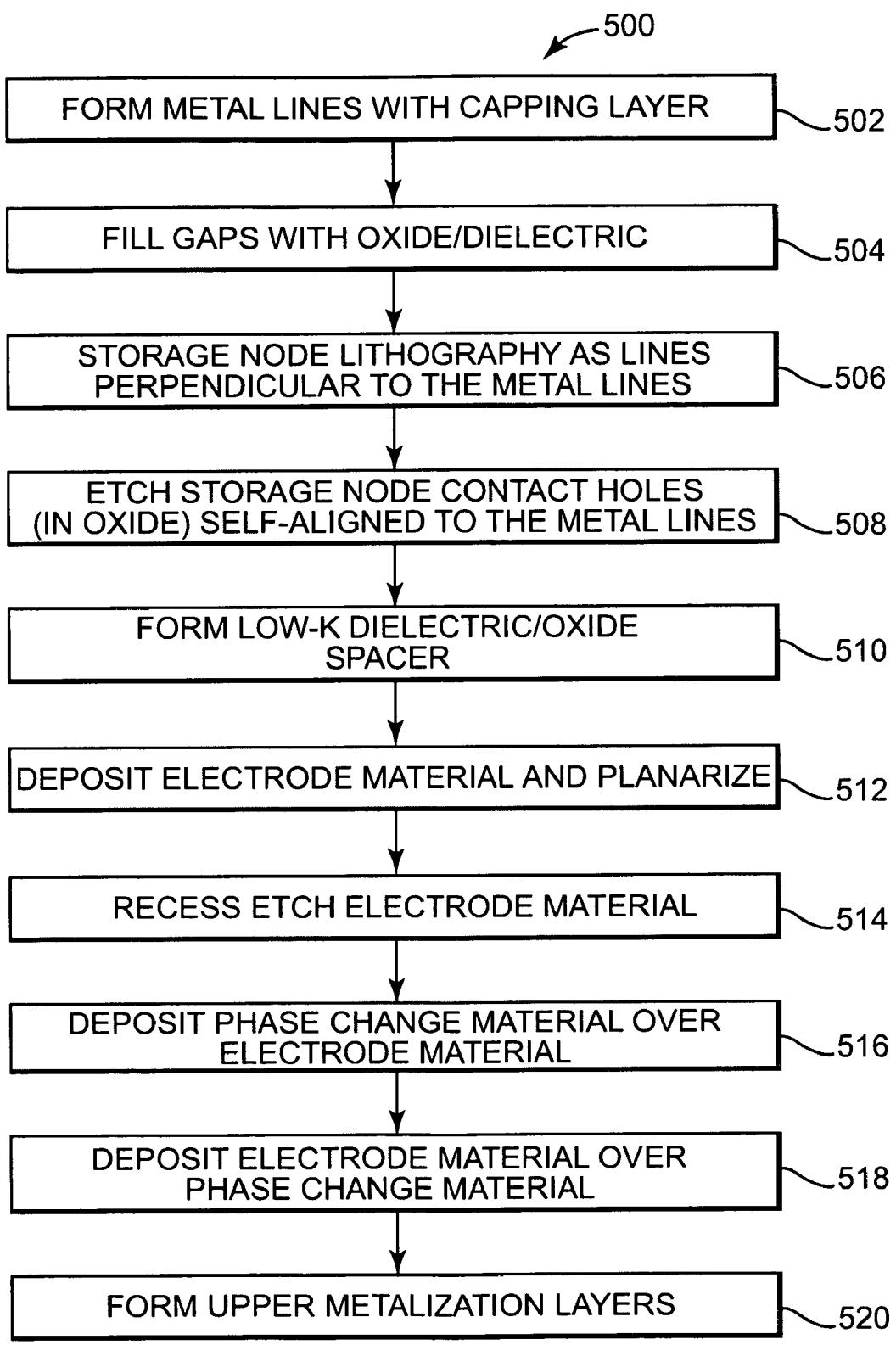
FIG. 11 is a flow diagram illustrating one embodiment of a method for fabricating a phase-change memory.

FIG. 11 is a flow diagram illustrating one embodiment of a method 500 for fabricating a phase-change memory. At 502, metal lines 114 and 402 with capping layers 410 and optional sidewall spacers are formed over a preprocessed wafer 302. At 504, the gaps between the metal lines are filled with an oxide or dielectric material 412. At 506, storage node lithography is performed as lines perpendicular to the metal lines 114 and 402. In another embodiment, the storage node lithography is performed as holes along paths running perpendicular to the metal lines 114 and 402. In another embodiment, the storage node lithography is performed along paths at an angle smaller than 90° to the metal lines 114 and 402.

At 508, storage node contact holes are etched in the oxide or dielectric material 412 self-aligned to the metal lines 114 and 402. At 510, a low-k dielectric or oxide spacer 408 is formed by deposition and etching to later thermally isolate the phase-change element. At 512, electrode material 304 is deposited in the contact holes and planarized. At 514, the electrode material 304 is recess etched to form an opening and a first electrode. At 516, phase-change material 106 is deposited over the electrode material 304 to form the phase-change elements 106. In one embodiment, step 510 is moved to after step 514 and before step 516. At 518, electrode material 416 is deposited over phase-change material 106 to form a second electrode. At 520, the upper metallization layers including bit lines 112 are formed.

Figure 12:
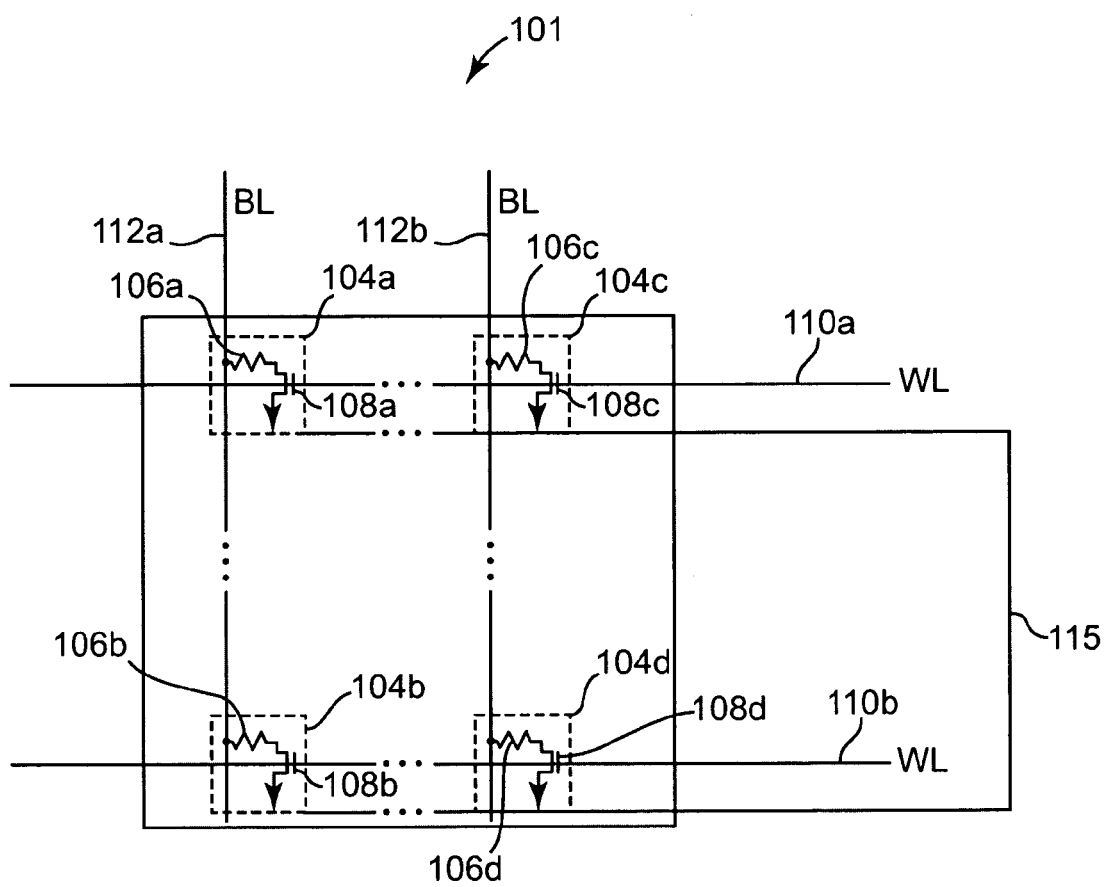
FIG. 12 is a diagram illustrating another embodiment of an array of phase-change memory cells.

FIG. 12 is a diagram illustrating another embodiment of an array of phase-change memory cells 101. Array of phase-change memory cells 101 is similar to array of phase-change memory cells 100 previously described and illustrated with reference to FIG. 1, except that in array of phase-change memory cells 101 ground lines 114a-114b are replaced with ground plate 115. In one embodiment, ground plate 115 is above bit lines 112. In another embodiment, ground plate 115 is below bit lines 112 and is perforated to allow pass-through contacts to phase change memory cells 104. In one embodiment, bit lines 112 thermally isolate phase-change memory cells 104. In another embodiment, ground plate 115 thermally isolates phase-change memory cells 104.

Figure 13A:
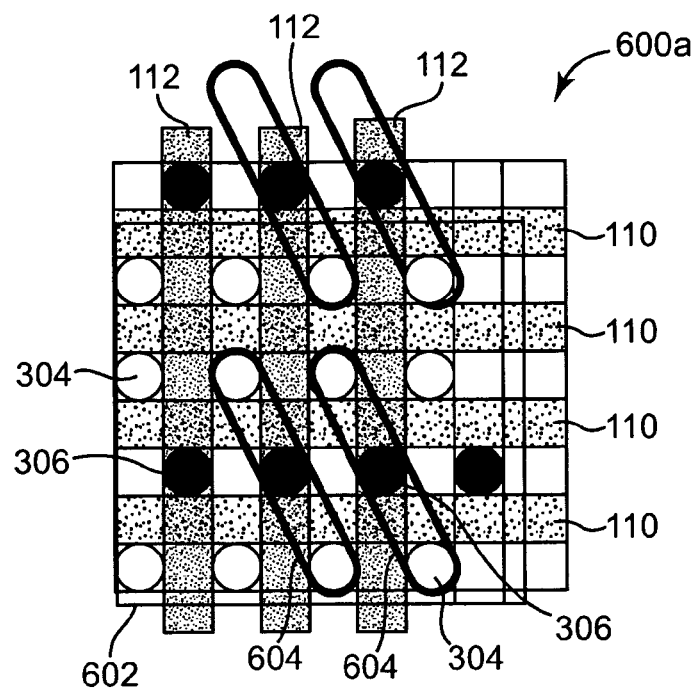
FIG. 13A illustrates a top view of one embodiment of an array of phase-change memory cells including a ground plate.

FIG. 13A illustrates a top view of one embodiment of an array of phase-change memory cells 600a including a ground plate 602. Array of phase-change memory cells 600a includes bit lines 112, ground plate 602, and word lines 110. Memory cells are electrically coupled to ground plate 602 through contacts 304. Memory cells are electrically coupled to bit lines 112 through contacts 306. Word lines 110 are perpendicular to bit lines 112. Bit lines 112 provide thermal isolation between adjacent memory cells as indicated by memory cell contacts 304.

Array of phase-change memory cells 600a includes single gate phase-change memory cells. Array of phase-change memory cells 600a is scalable to $6F^2$, where F is the minimum feature size. In other embodiments, wider transistors are used such that the distance between contacts 304 is increased. Bit lines 112 are electrically coupled to one side of the source-drain paths of transistors through contacts 306. Each contact 306 is shared by two transistors for accessing two phase-change memory elements. Word lines 110 are electrically coupled to the gates of the transistors. The other sides of the source-drain paths of the transistors are electrically coupled to one side of the phase-change memory elements through contacts 304. The other sides of the phase-change memory elements are electrically coupled to ground plate 602. Ground plate 602 simplifies the fabrication process of array of phase-change memory cells 600a since plate fabrication is simpler than line lithography. In one embodiment, ground plate 602 is above bit lines 112. In another embodiment, bit lines 112 are above ground plate 602. Ground plate 602 is a conductive plate, which in operation is at 0V or another suitable potential.

The active areas of transistors within array of phase-change memory cells 600a are indicated at 604. Active areas 604 are configured diagonally across array of phase-change memory cells 600a from an upper left contact 304 to a lower right contact 304. Active areas 604 run from one contact 304 across a first word line 110 to a bit line 112, and from the bit line 112 across a second word line 110 to a second contact 304.

Figure 13B:
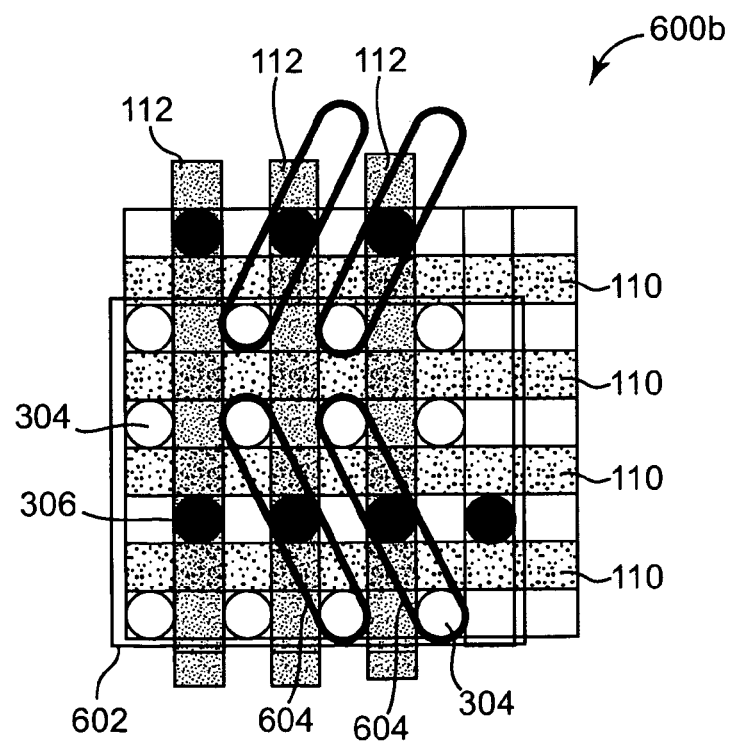
FIG. 13B illustrates a top view of another embodiment of an array of phase-change memory cells including a ground plate.

FIG. 13B illustrates a top view of another embodiment of an array of phase-change memory cells 600b including a ground plate 602. Array of phase-change memory cells 600b is similar to array of phase-change memory cells 600a previously described and illustrated with reference to FIG. 13A, except that in array of phase-change memory cells 600b active areas 604 are configured in alternating diagonal directions across the array. Active areas 604 alternate between running from an upper right contact 304 to a lower left contact 304 and from an upper left contact 304 to a lower right contact 304.

Figure 13C:
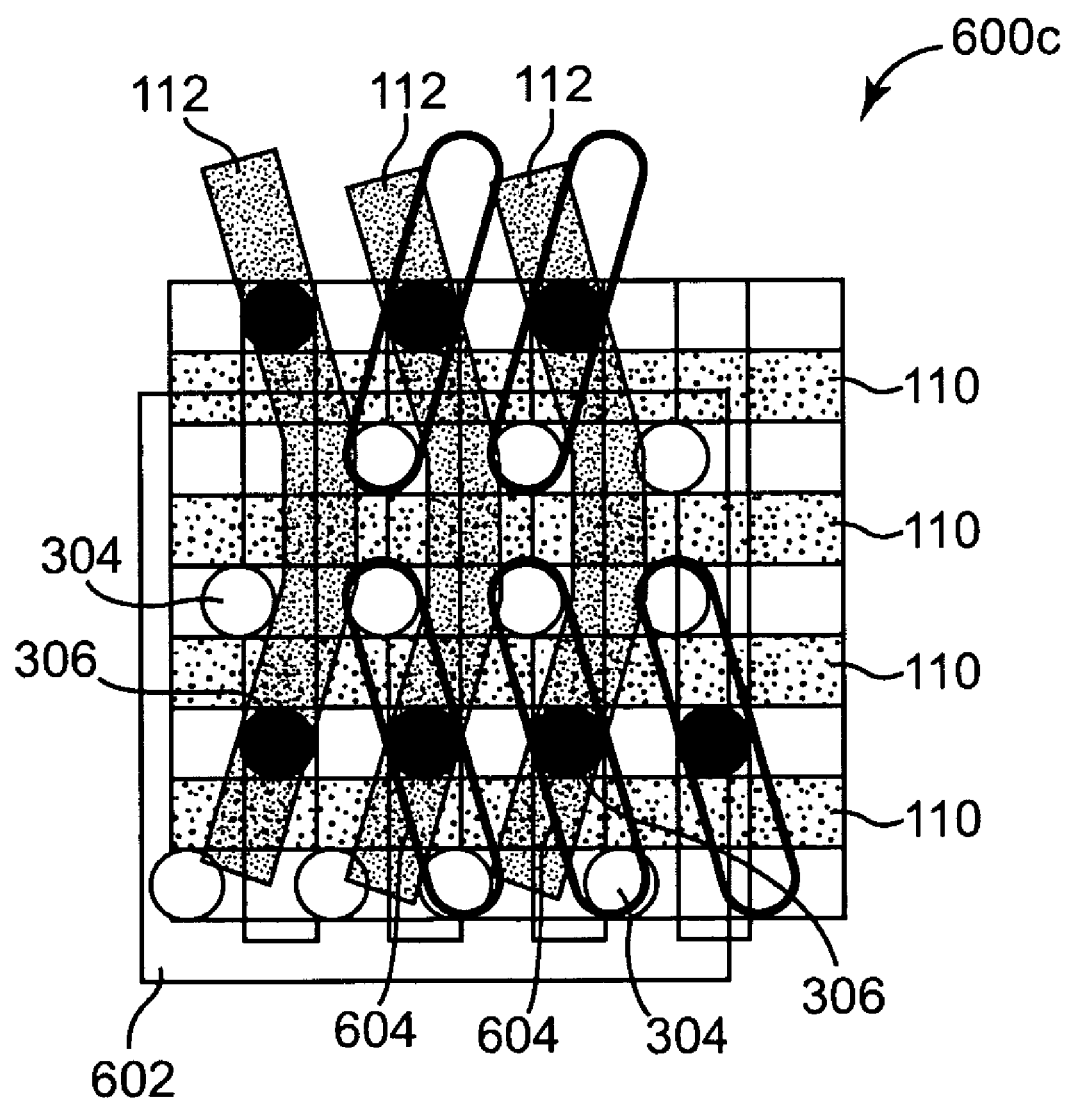
FIG. 13C illustrates a top view of another embodiment of an array of phase-change memory cells including a ground plate.

FIG. 13C illustrates a top view of another embodiment of an array of phase-change memory cells 600c including a ground plate 602. Array of phase-change memory cells 600c is similar to array of phase-change memory cells 600b previously described and illustrated with reference to FIG. 13B, except that in array of phase-change memory cells 600c bit lines 112 are not straight lines. Bit lines 112 zigzag across array of phase-change memory cells 600c between contacts 304.

Figure 14A:
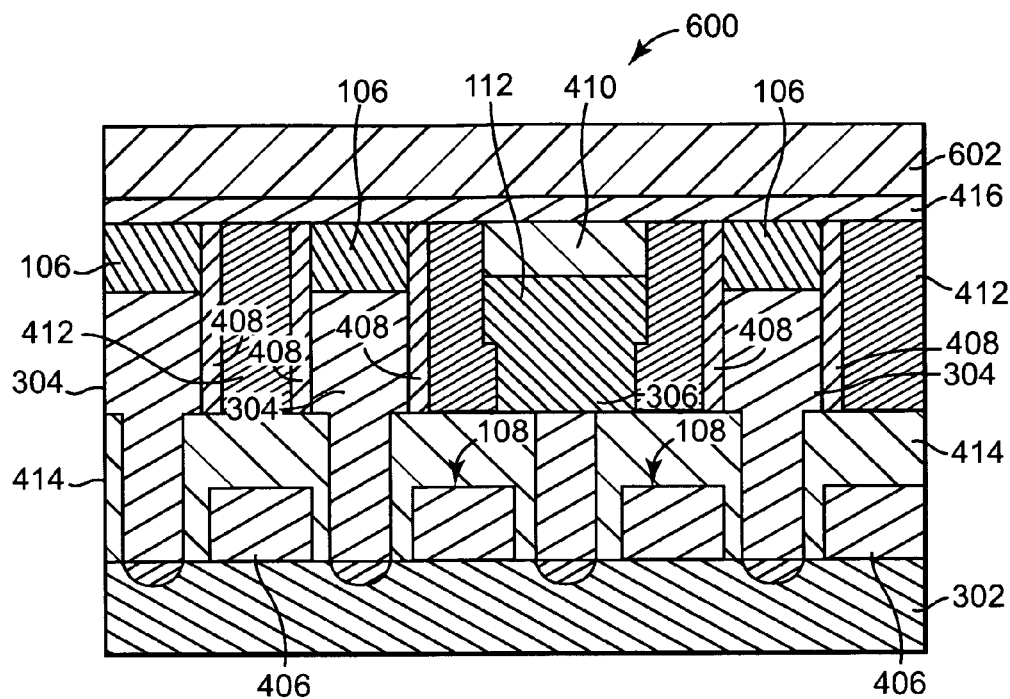
FIG. 14A illustrates a side view of one embodiment of an array of phase-change memory cells including a ground plate.
Figures 14B, 14C:
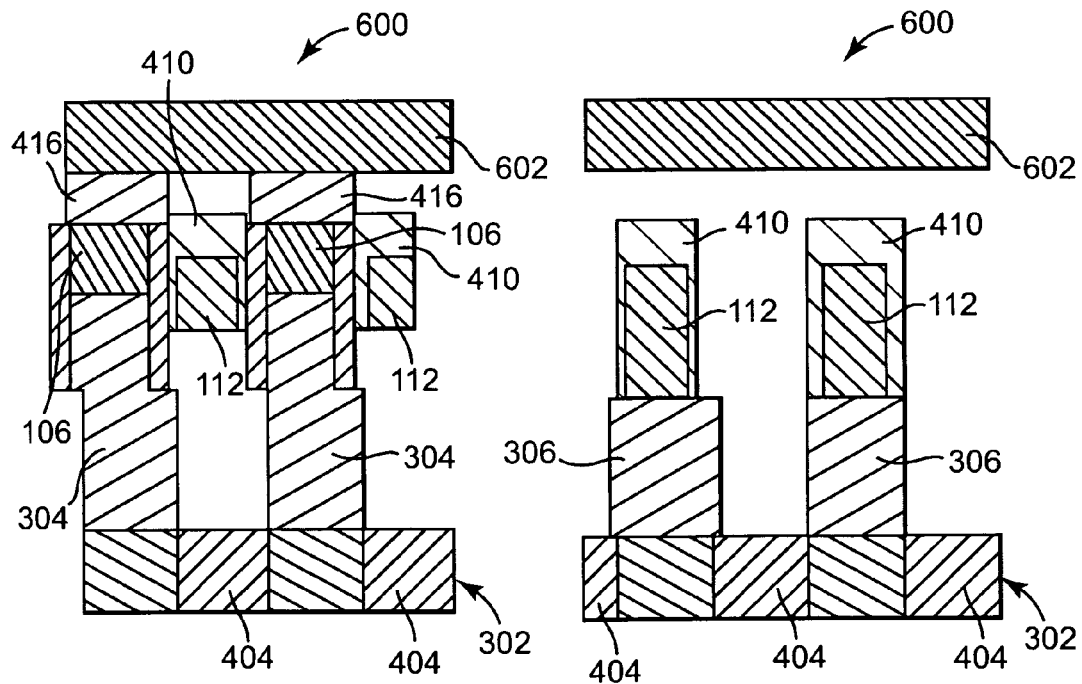
FIG. 14B illustrates a side view of one embodiment of an array of phase-change memory cells including a ground plate.
FIG. 14C illustrates a side view of one embodiment of an array of phase-change memory cells including a ground plate.

FIG. 14A illustrates a side view of one embodiment of array of phase-change memory cells 600 including a ground plate 602. FIG. 14A is taken diagonally along an active area 604 (FIG. 13A) and to a contact 304 in the same column with a contact 304 that is part of active area 604. FIG. 14B illustrates a side view of one embodiment of array of phase-change memory cells 600 through a phase-change element 106, and FIG. 14C illustrates another side view of one embodiment of array of phase-change memory cells 600 through a bit line 112. Array of phase-change memory cells 600 includes substrate 302 including shallow trench isolation 404, transistors 108, isolation gates 406, ground plate 602, capping layer 410, spacers 408, phase-change elements 106, phase-change element contacts 304 each including an electrode, bit line contacts 306, electrodes 416, bit line 112, and dielectric material 412 and 414.

Transistors 108 for selecting phase-change elements 106 are formed on substrate 302. The gates of transistors 108 are electrically coupled to word lines 110. Isolation gates 406 are formed on substrate 302 between transistors 108. Dielectric material 414 is deposited over transistors 108 and isolation gates 406. Phase-change element contacts 304 electrically couple one side of the source-drain path of each transistor 108 to a phase-change element 106, and bit line contacts 306 electrically couple the other side of the source-drain path of each transistor 108 to a bit line 112. Spacers 408 surround phase-change elements 106 and optionally phase-change element contacts 304 to provide a sublithographic width for phase-change elements 106.

Spacers 408 thermally isolate phase-change elements 106. Bit lines 112 provide heat spreaders to dissipate heat that passes through spacers 408 from phase-change elements 106. In one embodiment, a SiN or other suitable material capping layer 410 caps bit lines 112. Optionally, capping material 410 is also formed at the side walls of bit lines 112. Capping layer 410 acts as a masking layer during storage node etch and further insulates phase-change elements 106 and reduces the width of the opening where phase-change material is deposited. Electrodes 416 electrically couple phase-change elements 106 to ground plate 602. Array of phase-change memory cells 600 is fabricated similarly to method 500 previously described and illustrated with reference to FIG. 11.

Figure 15A:
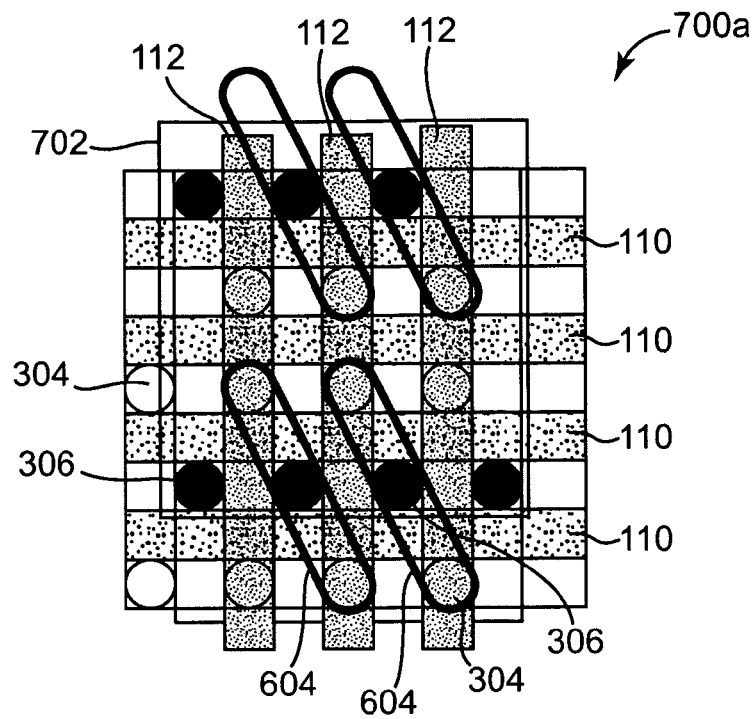
FIG. 15A illustrates a top view of another embodiment of an array of phase-change memory cells including a ground plate.

FIG. 15A illustrates a top view of another embodiment of an array of phase-change memory cells 700a including a ground plate 702. Array of phase-change memory cells 700a includes bit lines 112, ground plate 702, and word lines 110. Memory cells are electrically coupled to ground plate 702 through contacts 306. Memory cells are electrically coupled to bit lines 112 through contacts 304. Word lines 110 are perpendicular to bit lines 112. Ground plate 702 provides thermal isolation between adjacent memory cells as indicated by memory cell contacts 304.

Array of phase-change memory cells 700a includes single gate phase-change memory cells. Array of phase-change memory cells 700a is scalable to 6F², where F is the minimum feature size. Bit lines 112 are electrically coupled to one side of the phase-change memory elements. The other sides of the phase-change memory elements are electrically coupled to one side of the source-drain paths of the transistors through contacts 304. Word lines 110 are electrically coupled to the gates of the transistors. The other sides of the source-drain paths of the transistors are electrically coupled to ground plate 702 through contacts 306. Each contact 306 is shared by two transistors for accessing two phase-change memory elements. Ground plate 702 simplifies the fabrication process of array of phase-change memory cells 700a since plate fabrication is simpler than line lithography. In one embodiment, ground plate 702 is below bit lines 112. In this embodiment, ground plate 702 is perforated to allow the feed-through of contacts 304. An isolating spacer is used in these feed-through areas to avoid electrical shorting. In another embodiment, bit lines 112 are below ground plate 702. In both embodiments, ground plate 702 is a conductive plate, which in operation is at 0V or another suitable potential.

The active areas of transistors within array of phase-change memory cells 700a are indicated at 604. Active areas 604 are configured diagonally across array of phase-change memory cells 700a from an upper left contact 304 to a lower right contact 304. Active areas 604 run from one contact 304 at a first bit line 112 across a first word line 110 to a contact 306, and from contact 306 across a second word line 110 to a second contact 304 at a second bit line 112.

Figure 15B:
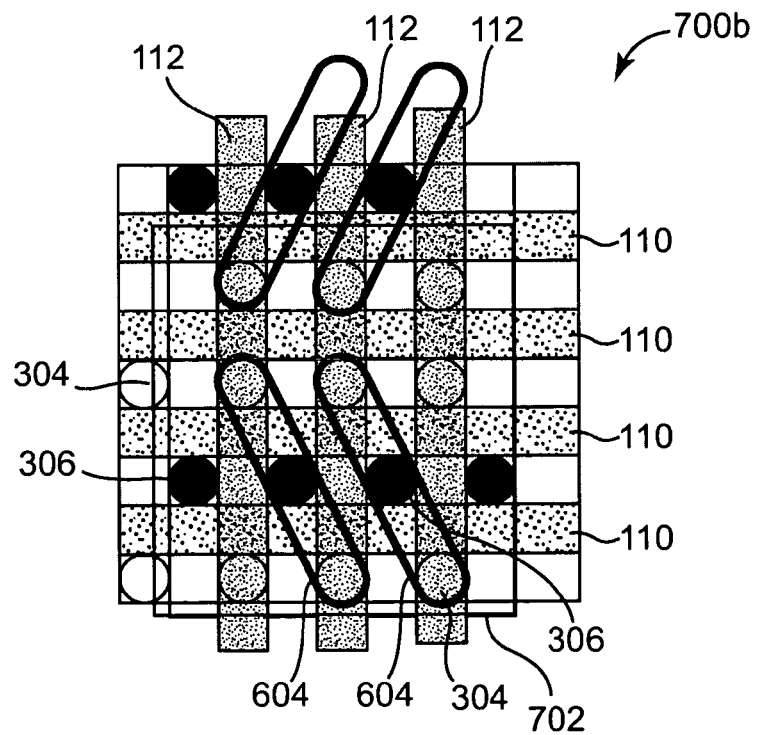
FIG. 15B illustrates a top view of another embodiment of an array of phase-change memory cells including a ground plate.

FIG. 15B illustrates a top view of another embodiment of an array of phase-change memory cells 700b including a ground plate 702. Array of phase-change memory cells 700b is similar to array of phase-change memory cells 700a previously described and illustrated with reference to FIG. 15A, except that in array of phase-change memory cells 700b active areas 604 are configured in alternating diagonal directions across the array. Active areas 604 alternate between running from an upper right contact 304 to a lower left contact 304 and from an upper left contact 304 to a lower right contact 304.

Figure 15C:
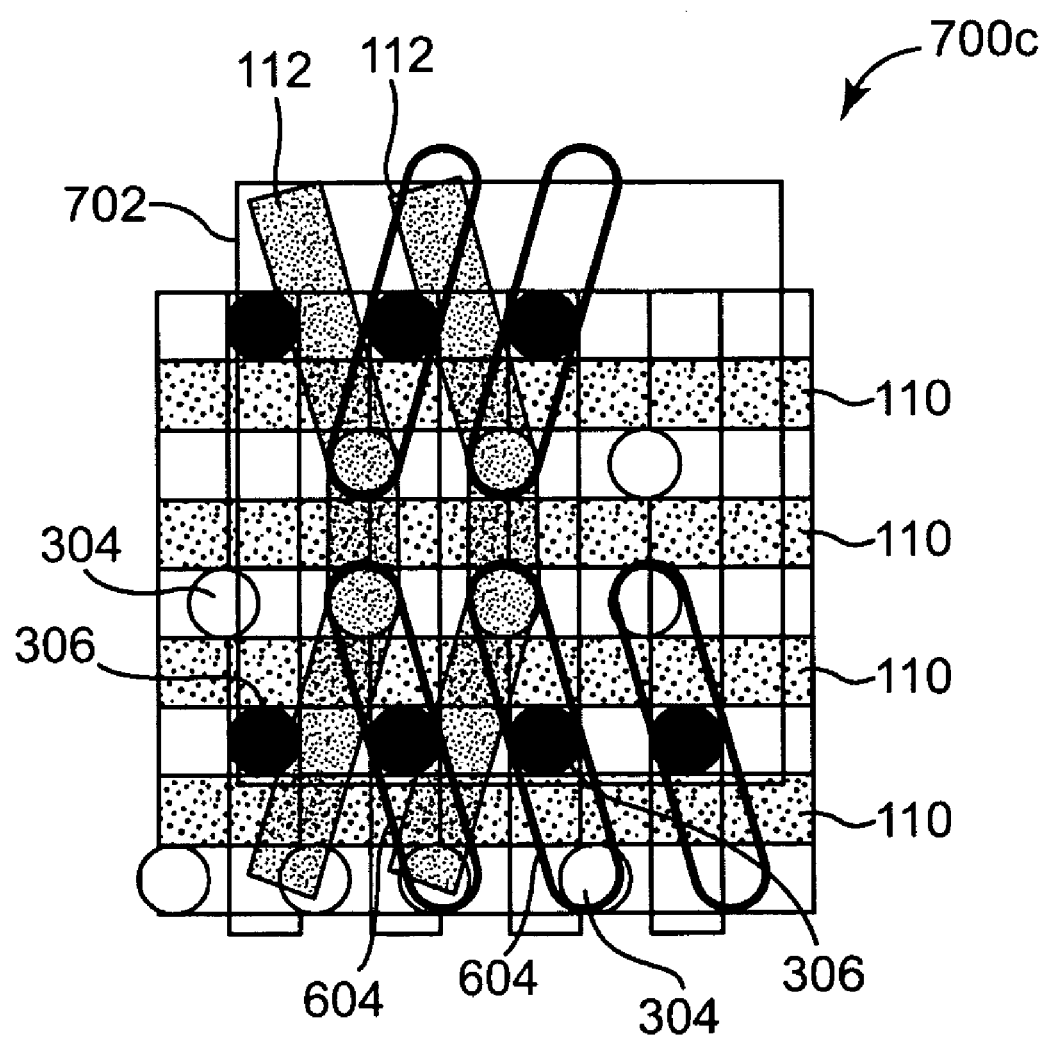
FIG. 15C illustrates a top view of another embodiment of an array of phase-change memory cells including a ground plate.

FIG. 15C illustrates a top view of another embodiment of an array of phase-change memory cells 700c including a ground plate 702. Array of phase-change memory cells 700c is similar to array of phase-change memory cells 700b previously described and illustrated with reference to FIG. 15B, except that in array of phase-change memory cells 700c bit lines 112 are not straight lines. Bit lines 112 zigzag across array of phase-change memory cells 700c between contacts 306.

Figure 16A:
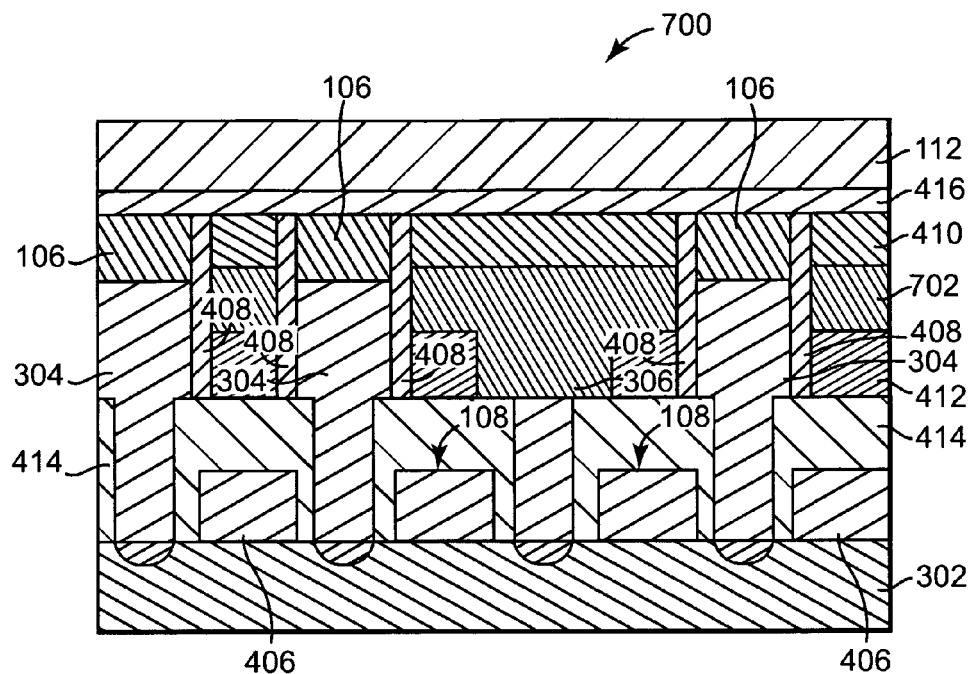
FIG. 16A illustrates a side view of one embodiment of an array of phase-change memory cells including a ground plate.
Figures 16B, 16C:
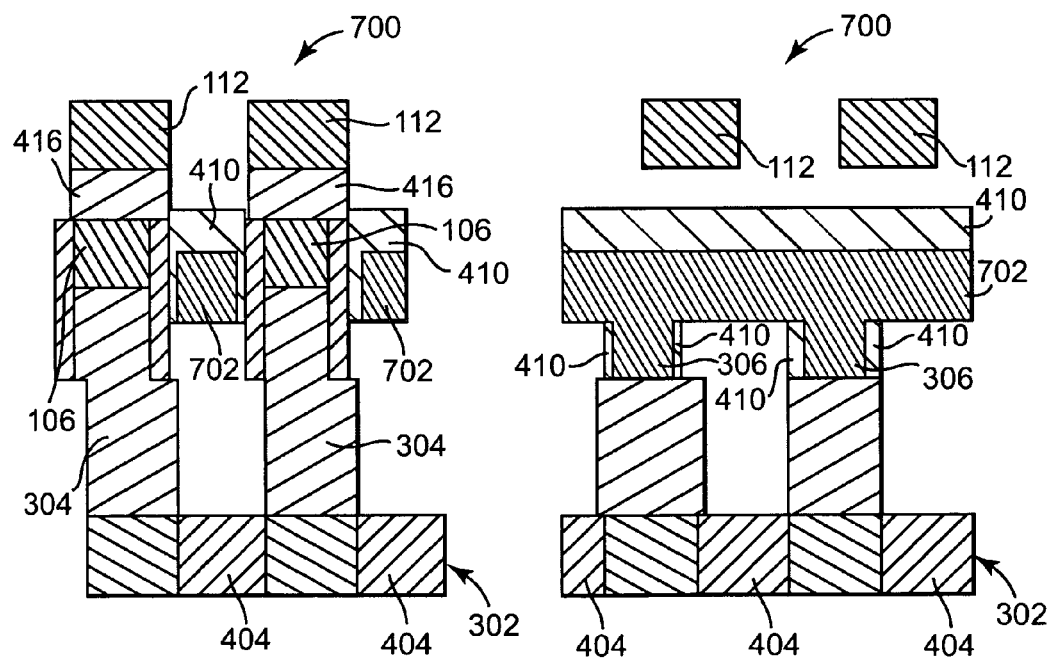
FIG. 16B illustrates a side view of one embodiment of an array of phase-change memory cells including a ground plate.
FIG. 16C illustrates a side view of one embodiment of an array of phase-change memory cells including a ground plate.

FIG. 16A illustrates a side view of one embodiment of array of phase-change memory cells 700 including a perforated ground plate 702. FIG. 16A is taken diagonally along an active area 604 (FIG. 15A) and to a contact 304 in the same column with a contact 304 that is part of active area 604. FIG. 16B illustrates a side view of one embodiment of array of phase-change memory cells 700 through a phase-change element 106, and FIG. 16C illustrates another side view of one embodiment of array of phase-change memory cells 700 through a contact 306. Array of phase-change memory cells 700 includes substrate 302 including shallow trench isolation 404, transistors 108, isolation gates 406, ground plate 702, capping layer 410, spacers 408, phase-change elements 106, phase-change element contacts 304 each including an electrode, ground plate contacts 306, electrodes 416, bit lines 112, and dielectric material 412 and 414.

Transistors 108 for selecting phase-change elements 106 are formed on substrate 302. The gates of transistors 108 are electrically coupled to word lines 110. Isolation gates 406 are formed on substrate 302 between transistors 108. Dielectric material 414 is deposited over transistors 108 and isolation gates 406. Phase-change element contacts 304 electrically couple one side of the source-drain path of each transistor 108 to a phase-change element 106, and ground plate contacts 306 electrically couple the other side of the source-drain path of each transistor 108 to ground plate 702. Spacers 408 surround phase-change elements 106 and optionally phase-change element contacts 304 to provide a sublithographic width for phase-change elements 106 and provide electrical insulation against ground plate 702.

Spacers 408 thermally isolate phase-change elements 106. Ground plate 702 extends between phase-change elements 106. Ground plate 702 provides a heat spreader to dissipate heat that passes through spacers 408 from phase-change elements 106. In one embodiment, a SiN or other suitable material capping layer 410 caps ground plate 702. Optionally, capping material 410 is also formed at the sidewalls of ground plate 702. Capping layer 410 acts as a masking layer during storage node etch and further insulates phase-change elements 106 and reduces the width of the openings where phase-change material is deposited. Electrodes 416 electrically couple phase-change elements 106 to bit line 112. Array of phase-change memory cells 700 is fabricated similarly to method 500 previously described and illustrated with reference to FIG. 11.

Figure 17A:
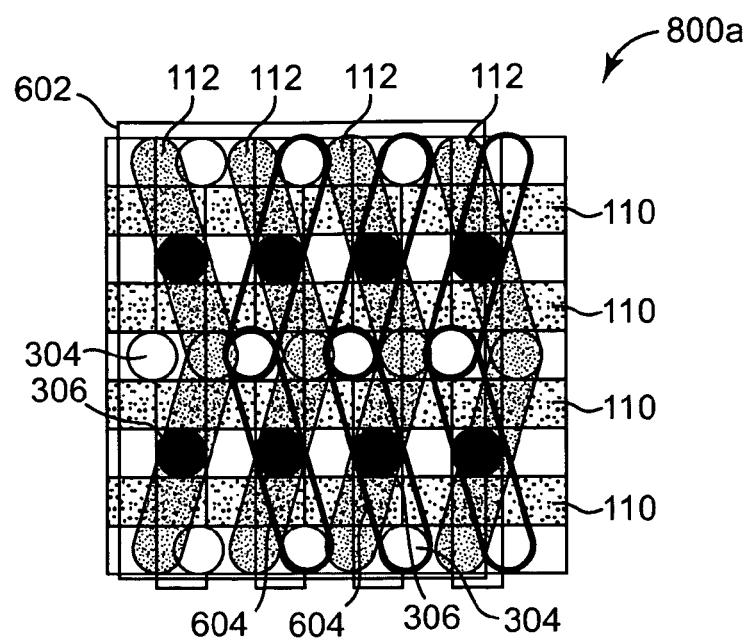
FIG. 17A illustrates a top view of another embodiment of an array of phase-change memory cells including a ground plate.

FIG. 17A illustrates a top view of another embodiment of an array of phase-change memory cells 800a including a ground plate 602. Array of phase-change memory cells 800a includes bit lines 112, ground plate 602, and word lines 110. Memory cells are electrically coupled to ground plate 602 through contacts 304. Memory cells are electrically coupled to bit lines 112 through contacts 306. Word lines 110 are straight lines and bit lines 112 are not straight lines. Bit lines 112 zigzag across the array of phase-change memory cells between contacts 304. Bit lines 112 provide thermal isolation between rows of memory cells as indicated by memory cell contacts 304.

Array of phase-change memory cells 800a includes dual gate phase-change memory cells. Array of phase-change memory cells 800a is scalable to 8F², where F is the minimum feature size. Bit lines 112 are electrically coupled to one side of the source-drain paths of the transistors through contacts 306. Each contact 306 is shared by two transistors for accessing two phase-change memory elements. Word lines 110 are electrically coupled to the gates of the transistors. The other sides of the source-drain paths of the transistors are electrically coupled to one side of phase-change memory elements through contacts 304. The other sides of the phase-change memory elements are electrically coupled to ground plate 602. Ground plate 602 simplifies the fabrication process of array of phase-change memory cells 800a since plate fabrication is simpler than line lithography. In one embodiment, ground plate 602 is above bit lines 112. In another embodiment, ground plate 602 is below bit lines 112 and has openings to allow the feed-though of the memory element contacts 304.

The active areas of transistors within array of phase-change memory cells 800a are indicated at 604. Active areas 604 are configured in alternating diagonal directions across array of phase-change memory cells 800a. Active areas 604 alternate between running from an upper right contact 304 to a lower left contact 304 and from the upper left contact 304 to a lower right contact 304. Active areas 604 run from one contact 304 across a first word line 110 to a bit line 112, and from the bit line 112 across a second word line 110 to a second contact 304.

Figure 17B:
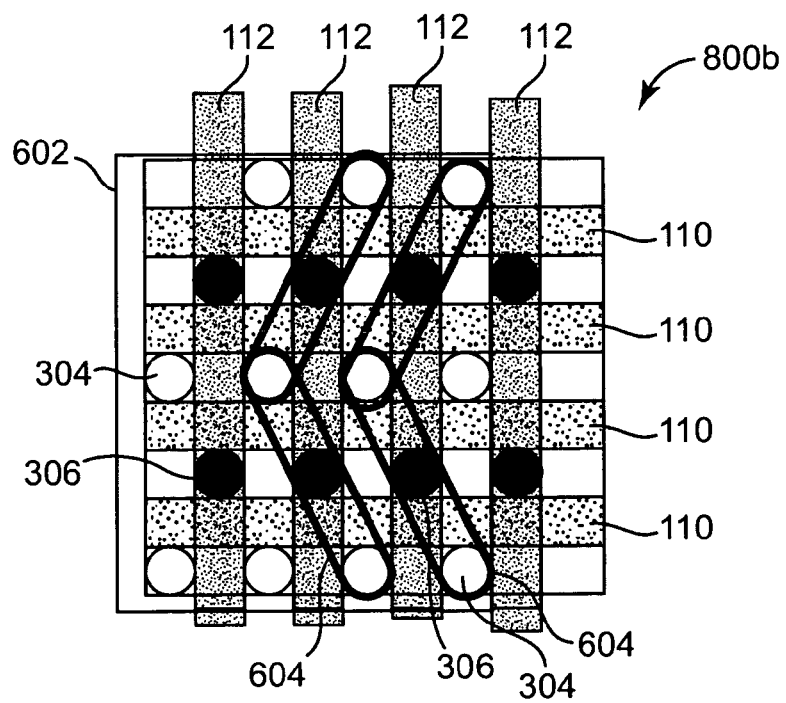
FIG. 17B illustrates a top view of another embodiment of an array of phase-change memory cells including a ground plate.

FIG. 17B illustrates a top view of another embodiment of an array of phase-change memory cells 800b including a ground plate 602. Array of phase-change memory cells 800b is similar to array of phase-change memory cells 800a previously described and illustrated with reference to FIG. 17A, except that in array of phase-change memory cells 800b bit lines 112 are straight lines and are substantially perpendicular to word lines 110.

Figure 17C:
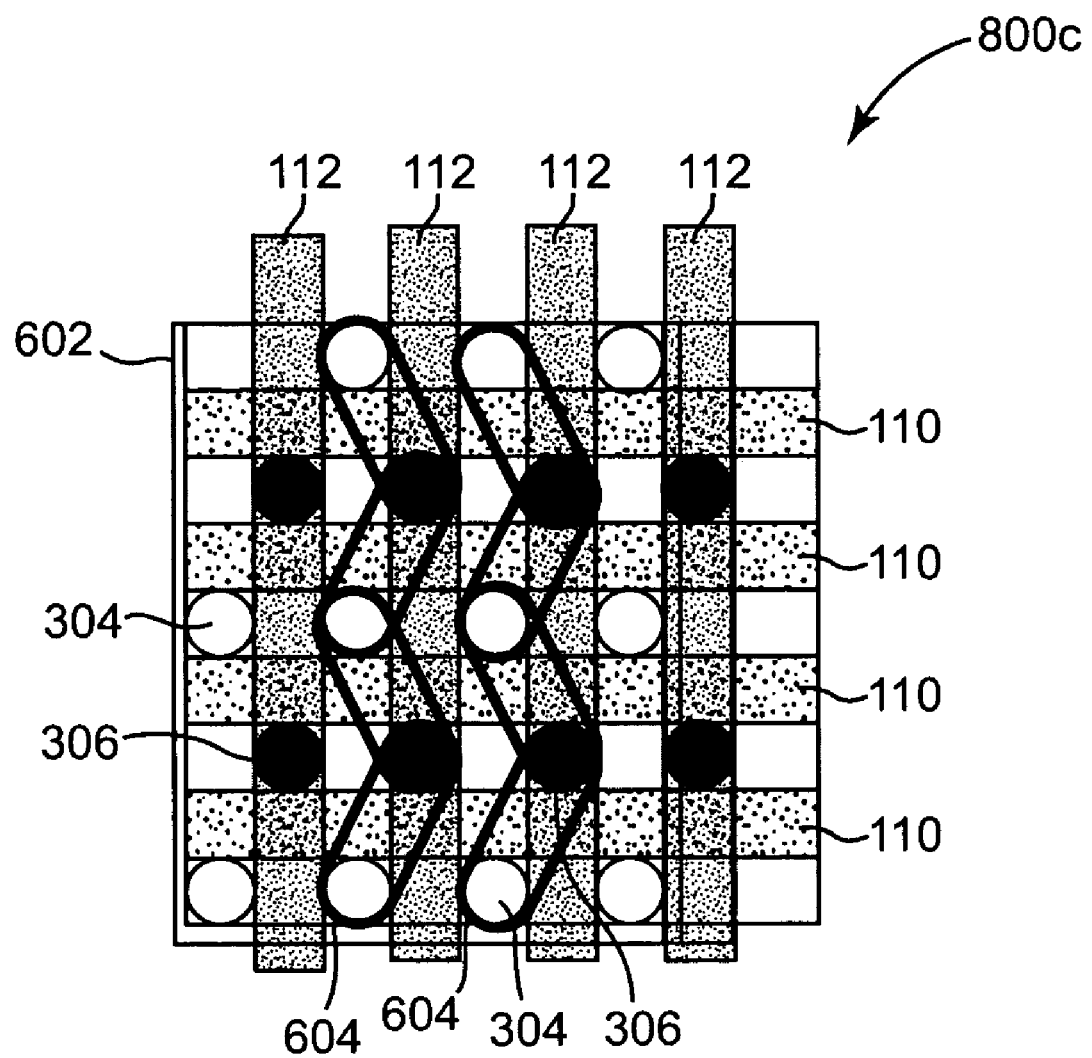
FIG. 17C illustrates a top view of another embodiment of an array of phase-change memory cells including a ground plate.

FIG. 17C illustrates a top view of another embodiment of an array of phase-change memory cells 800c including a ground plate 602. Array of phase-change memory cells 800c is similar to array of phase-change memory cells 800b previously described and illustrated with reference to FIG. 17B, except that in array of phase-change memory cells 800c active areas 604 alternate direction at each phase-change element. Active areas 604 zigzag across array of phase-change memory cells 800c along each bit line 112.

Figure 18A:
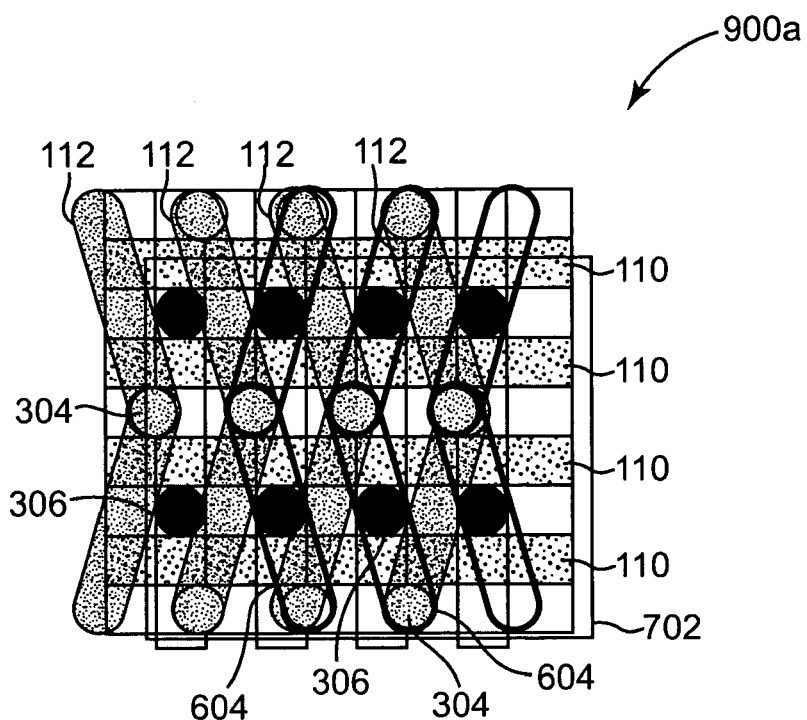
FIG. 18A illustrates a top view of another embodiment of an array of phase-change memory cells including a ground plate.

FIG. 18A illustrates a top view of another embodiment of an array of phase-change memory cells 900a including a ground plate 702. Array of phase-change memory cells 900a includes bit lines 112, ground plate 702, and word lines 110. Memory cells are electrically coupled to bit lines 112 through contacts 304. Memory cells are electrically coupled to ground plate 702 through contacts 306. Word lines 110 are straight lines and bit lines 112 are not straight lines. Bit lines 112 zigzag across the array of phase-change memory cells between contacts 306. Ground plate 702 facilitates the heat spreading away from memory cell contacts 304.

Array of phase-change memory cells 900a includes dual gate phase-change memory cells. Array of phase-change memory cells 900a is scalable to 8F$^2$, where F is the minimum feature size. Bit lines 112 are electrically coupled to one side of the phase-change memory elements. The other sides of the phase-change memory elements are electrically coupled to one side of the source-drain paths of the transistors through contacts 304. Word lines 110 are coupled to the gates of the transistors. The other sides of the source-drain paths of the transistors are electrically coupled to ground plate 702 through contacts 306. Each contact 306 is shared by two transistors for accessing two phase-change memory elements. Ground plate 702 simplifies the fabrication process of array of phase-change memory cells 900a since plate fabrication is simpler than line lithography. In one embodiment, ground plate 702 is below bit lines 112. In this embodiment, ground plate 702 is perforated to allow the electrically isolated feed-through of contacts 304 towards bit lines 112. In another embodiment, bit lines 112 are below ground plate 702.

The active areas of transistors within array of phase-change memory cells 900a are indicated at 604. Active areas 604 are configured in alternating diagonal directions across array of phase-change memory cells 900a. Active areas 604 alternate between running from an upper right contact 304 to a lower left contact 304 and from the upper left contact 304 to a lower right contact 304. Active areas 604 run from one contact 304 at a first bit line 112 across a first word line 110 to a contact 306, and from the contact 306 across a second word line 110 to a second contact 304 at a second bit line 112.

Figure 18B:
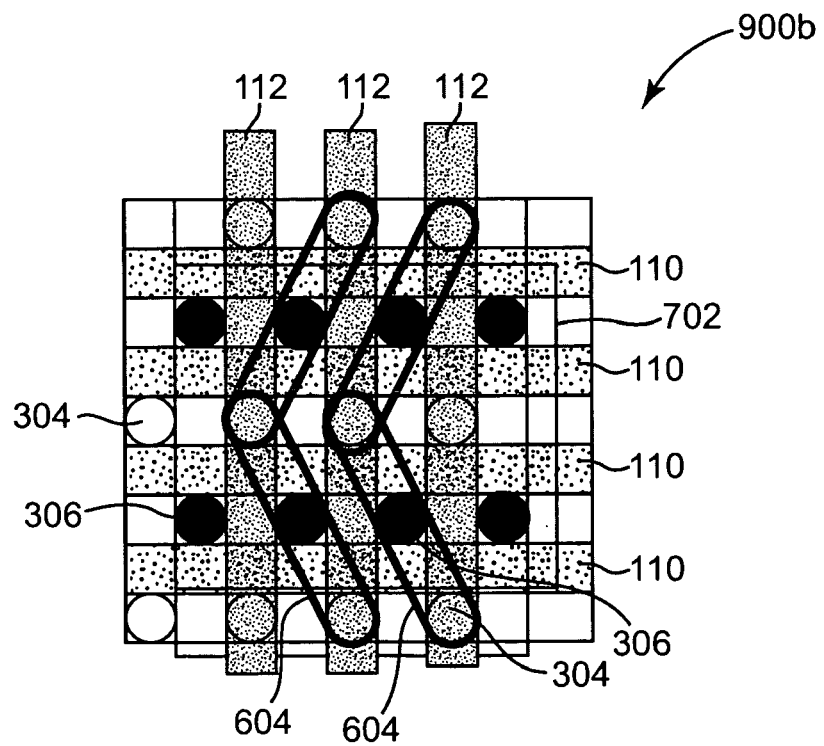
FIG. 18B illustrates a top view of another embodiment of an array of phase-change memory cells including a ground plate.

FIG. 18B illustrates a top view of another embodiment of an array of phase-change memory cells 900b including a ground plate 702. Array of phase-change memory cells 900b is similar to array of phase-change memory cells 900a previously described and illustrated with reference to FIG. 18A, except that in array of phase-change memory cells 900b bit lines 112 are straight lines and are perpendicular to word lines 110.

Figure 18C:
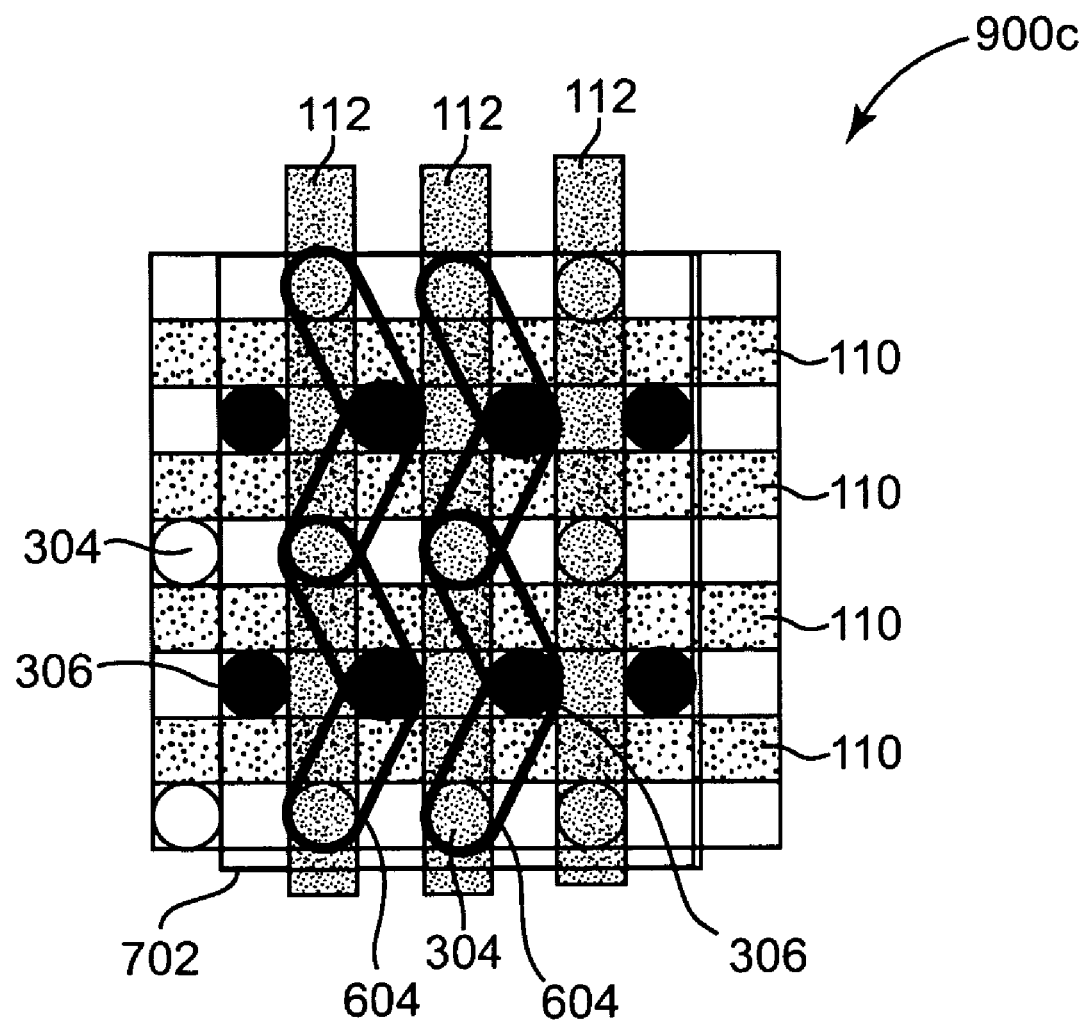
FIG. 18C illustrates a top view of another embodiment of an array of phase-change memory cells including a ground plate.

FIG. 18C illustrates a top view of another embodiment of an array of phase-change memory cells 900c including a ground plate 702. Array of phase-change memory cells 900c is similar to array of phase-change memory cells 900b previously described and illustrated with reference to FIG. 18B, except that in array of phase-change memory cells 900c active areas 604 alternate direction at each phase-change element. Active areas 604 zigzag across array of phase-change memory cells 900c along each bit line 112.

Figure 19A:
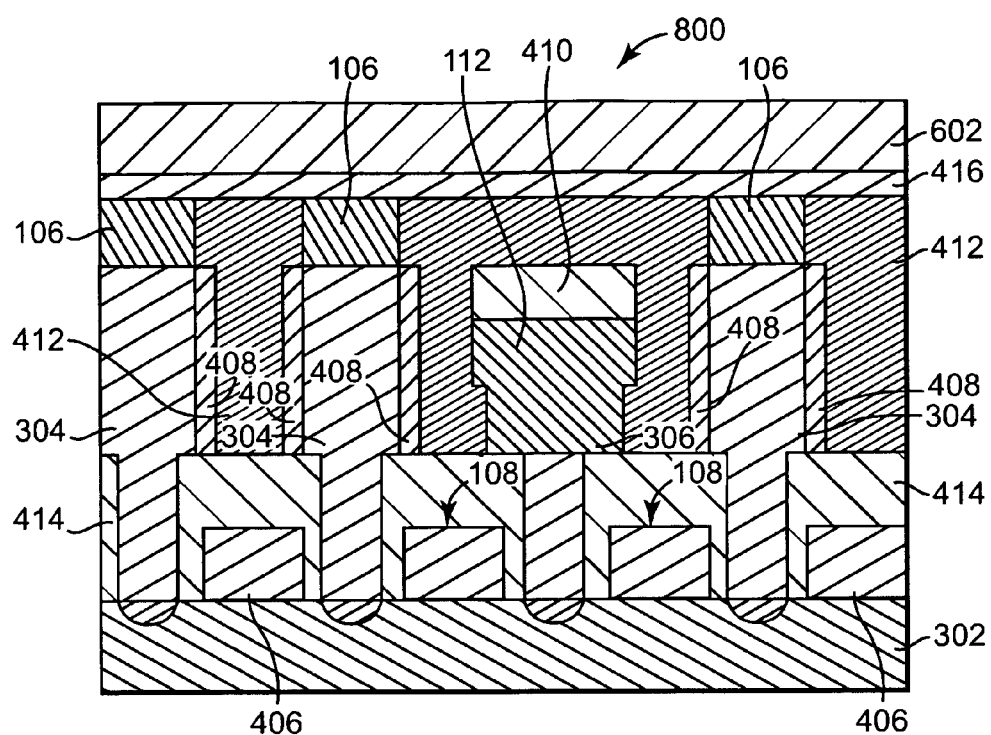
FIG. 19A illustrates a side view of another embodiment of an array of phase-change memory cells including a ground plate.
Figures 19B, 19C:
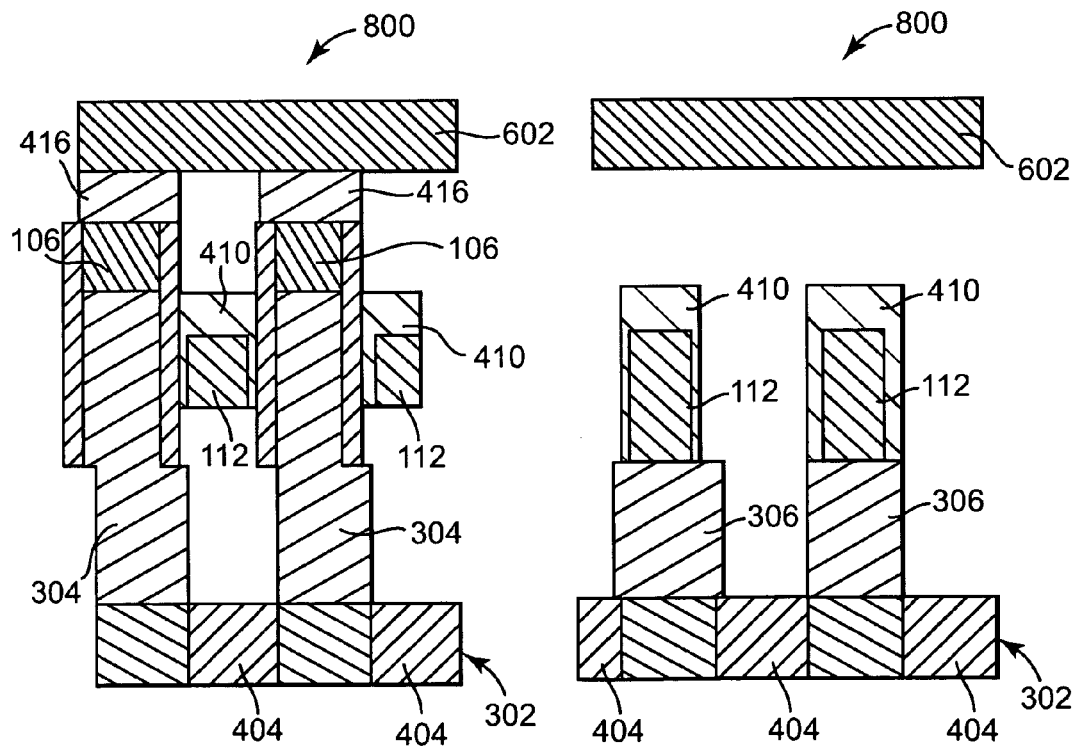
FIG. 19B illustrates a side view of another embodiment of an array of phase-change memory cells including a ground plate.
FIG. 19C illustrates a side view of another embodiment of an array of phase-change memory cells including a ground plate.

FIG. 19A illustrates a side view of another embodiment of an array of phase-change memory cells 800 including a ground plate 602. FIG. 19A is taken diagonally along an active area 604 (FIG. 13A) and to a contact 304 in the same column with a contact 304 that is part of active area 604. FIG. 19B illustrates a side view of one embodiment of array of phase-change memory cells 800 through a phase-change element 106, and FIG. 19C illustrates another side view of one embodiment of array of phase-change memory cells 800 through a bit line 112. Array of phase-change memory cells 800 is similar to array of phase-change memory cells 600 previously described and illustrated with reference to FIGS. 14A-14C, except that in array of phase-change memory cells 800, bits lines 112 and capping layer 410 are located in a horizontal plane below phase change elements 106. Therefore in this embodiment, bit lines 112 do not provide heat spreaders to dissipate heat that passes through spacers 408 from phase-change elements 106.

Figure 20A:
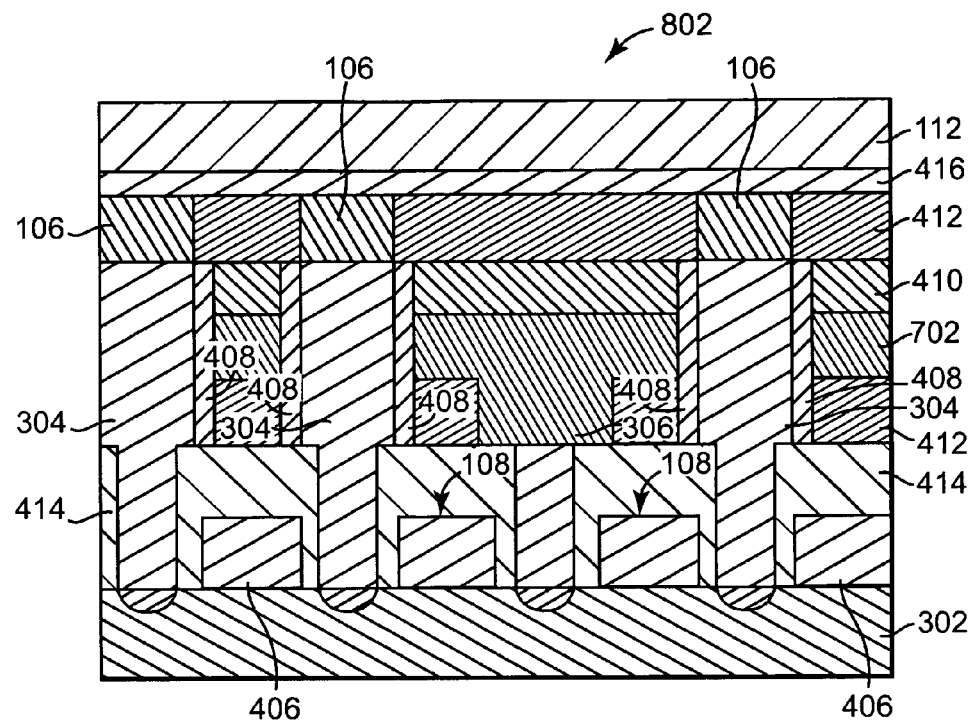
FIG. 20A illustrates a side view of another embodiment of an array of phase-change memory cells including a ground plate.
Figures 20B, 20C:
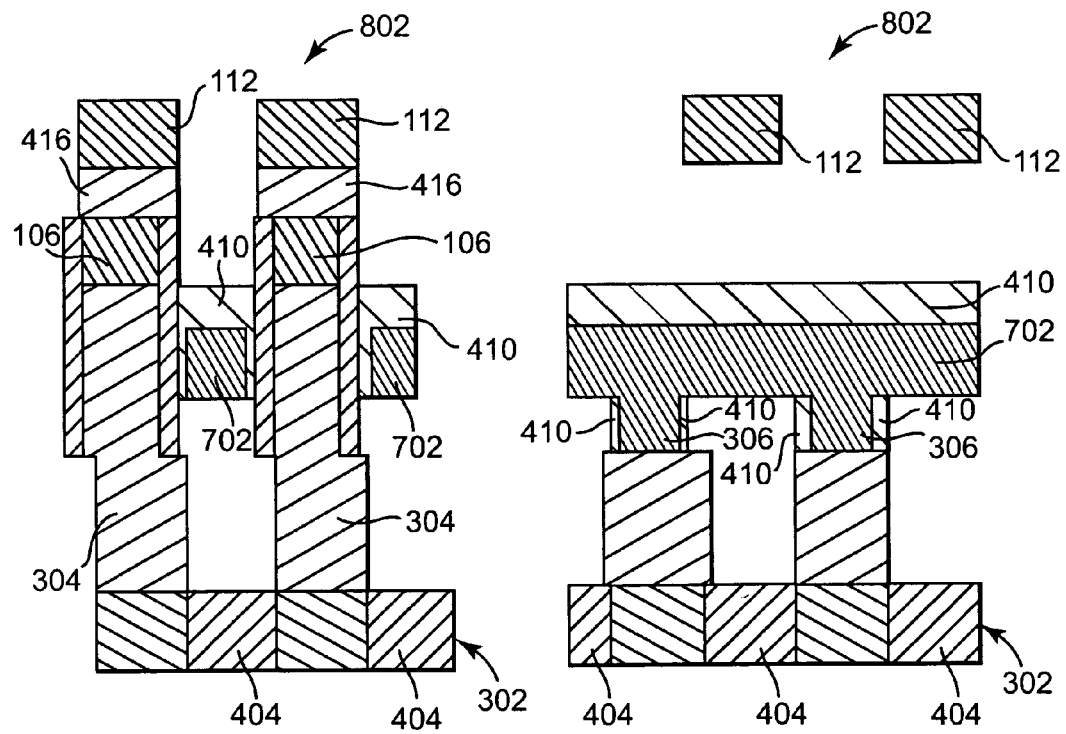
FIG. 20B illustrates a side view of another embodiment of an array of phase-change memory cells including a ground plate.
FIG. 20C illustrates a side view of another embodiment of an array of phase-change memory cells including a ground plate.

FIG. 20A illustrates a side view of another embodiment of an array of phase-change memory cells 802 including a ground plate 702, FIG. 20B illustrates a side view of one embodiment of array of phase-change memory cells 802 through a phase-change element 106, and FIG. 20C illustrates another side view of one embodiment of array of phase-change memory cells 802 through a contact 306. Array of phase-change memory cells 802 is similar to array of phase-change memory cells 700 previously described and illustrated with reference to FIGS. 16A-16C, except that in array of phase-change memory cells 802, ground plate 702 and capping layer 410 are located in a horizontal plane below phase change elements 106. Therefore in this embodiment, ground plate 702 does not provide a heat spreader to dissipate heat that passes through spacers 408 from phase-change elements 106.

Embodiments of the present invention provide phase-change memory array layouts for thermally isolating adjacent phase-change memory cells. By thermally isolating adjacent phase-change memory cells, thermal cross-talk is reduced and data retention is improved. Embodiments of the present invention enable operating temperatures above 80° C. for phase-change memories and provide improved stability of data at lower temperatures.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A memory comprising:
    an array of resistive memory cells arranged in rows and columns;
    bit lines coupled to each of the memory cells; and
    a conductive perforated plate laterally surrounding the memory cells for accessing the memory cells, the conductive perforated plate arranged over a plurality of rows and over a plurality of columns of the memory cells.

2. The memory of claim 1, wherein the conductive plate comprises a ground plate.

3. The memory of claim 1, wherein the memory cells comprise phase-change memory cells.

4. The memory of claim 1, wherein the conductive plate is below the bit lines.

5. The memory of claim 1, further comprising:
    word lines substantially perpendicular to the bit lines, each word line for controlling a transistor having a source-drain path coupled between the conductive plate and a memory element.

6. The memory of claim 1, wherein the conductive plate thermally isolates the memory cells.

7. An integrated circuit comprising:
    an array of resistive memory cells, each memory cell including a transistor and a memory element;
    bit lines coupled to each of the memory cells;
    a plurality of electrodes, each electrode coupled to a memory cell; and
    a around plate directly coupled to each of the electrodes within at least two rows and at least two columns of the memory cells, the ground plate arranged above the plurality of electrodes and above a plurality of rows and above a plurality of columns of the transistors,
    wherein the bit lines are above the ground plate and the ground plate is perforated.

8. The integrated circuit of claim 7, wherein the array of memory cells comprises an array of single gate memory cells.

9. An integrated circuit comprising:
    an array of resistive memory cells, each memory cell including a transistor and a memory element;
    bit lines coupled to each of the memory cells;
    a plurality of electrodes, each electrode coupled to a memory cell; and
    a ground plate directly coupled to each of the electrodes within at least two rows and at least two columns of the memory cells, the around plate arranged above the plurality of electrodes and above a plurality of rows and above a plurality of columns of the transistors,
    wherein the array of memory cells comprises an array of dual gate memory cells.

10. The integrated circuit of claim 9, wherein the bit lines are below the ground plate.

11. The integrated circuit of claim 9, wherein the bit lines thermally isolate the memory cells.

12. The integrated circuit of claim 9, wherein the ground plate thermally isolates the memory cells.

13. A method for fabricating a memory, the method comprising:
    providing an array of resistive memory cells arranged in rows and columns;
    providing bit lines coupled to each of the memory cells; and
    providing a perforated conductive plate laterally surrounding the memory cells for accessing the memory cells, the perforated conductive plate arranged over a plurality of rows and over a plurality of columns of the memory cells.

14. The method of claim 13, wherein providing the array of memory cells comprises providing an array of phase-change memory cells.

15. The method of claim 13, further comprising:
    providing word lines substantially perpendicular to the bit lines, each word line for controlling a transistor having a source-drain path coupled between a memory element and the conductive plate.

16. The method of claim 13, wherein providing the conductive plate comprises providing the conductive plate for thermally isolating the memory cells.

* * * * *